United States Patent
Kawasaki et al.

(10) Patent No.: US 6,382,249 B1
(45) Date of Patent: May 7, 2002

(54) VACUUM EXHAUST SYSTEM

(75) Inventors: Hiroyuki Kawasaki, Chigasaki; Hiroshi Sobukawa, Zama, both of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/671,745

(22) Filed: Sep. 29, 2000

(30) Foreign Application Priority Data

Oct. 4, 1999 (JP) ............................................. 11-283367

(51) Int. Cl.⁷ ............................. C23C 16/00; E03B 5/00
(52) U.S. Cl. ............................. 137/565.3; 137/565.33; 118/50; 118/715
(58) Field of Search ........................ 137/565.3, 565.33; 118/715, 50

(56) References Cited

U.S. PATENT DOCUMENTS

| | | | |
|---|---|---|---|
| 4,487,058 A | * 12/1984 | Mennenga | 73/40.7 |
| 5,079,031 A | * 1/1992 | Yamazaki et al. | 118/723 |
| 5,154,572 A | 10/1992 | Toyoshima et al. | 415/90 |
| 5,695,316 A | 12/1997 | Schütz et al. | 415/90 |
| 5,863,842 A | * 1/1999 | Ohmi | 438/758 |

FOREIGN PATENT DOCUMENTS

| | | |
|---|---|---|
| JP | 8-319946 | 12/1996 |
| JP | 9-221381 | 6/1997 |
| JP | 10-125657 | 5/1998 |

OTHER PUBLICATIONS

"Tamdem Use of Turbopumps", IBM Technical Disclosure Bulletin, vol. 34, No. 10B, Mar. 1992, p. 262.

* cited by examiner

*Primary Examiner*—A. Michael Chambers
(74) *Attorney, Agent, or Firm*—Armstrong, Westerman & Hattori, LLP

(57) ABSTRACT

A vacuum exhaust system comprising a vacuum chamber; means for introducing a gas into the vacuum chamber; a main pump for exhausting the vacuum chamber and reducing a pressure of the vacuum chamber to a desired pressure; an auxiliary pump disposed downstream from the main pump; and piping for connecting them, wherein an outer diameter of connecting piping as a connection between the main pump and the auxiliary pump is ½ inch (12.7 mm) or less; and a length of the connecting piping and capability of the auxiliary pump are combined so that a back pressure of the main pump becomes 5 Torr or more. This vacuum exhaust system can realize cost reduction through a saving in entire space, simplification of piping construction work, and so on.

4 Claims, 21 Drawing Sheets

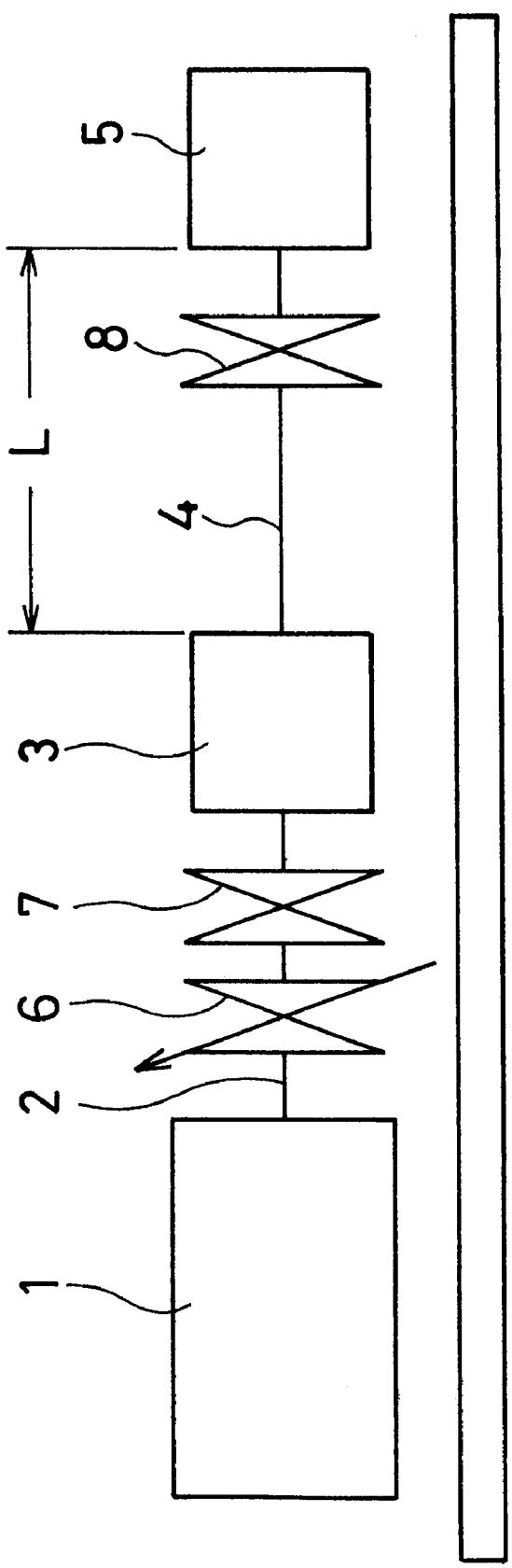

F I G. 2
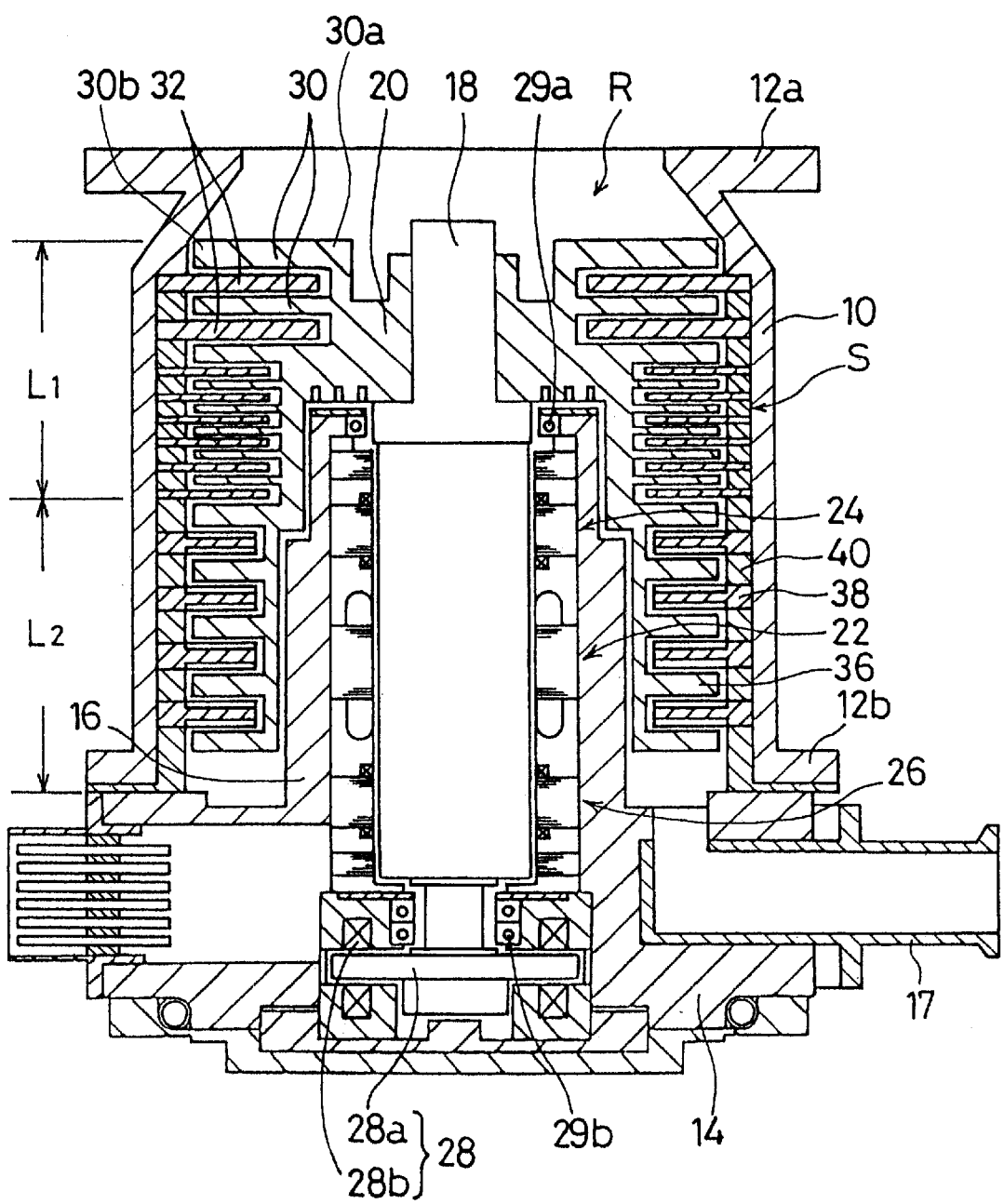

Chart of exhaust speed curves of vacuum exhaust system of this invention

Chart of exhaust speed curves of conventional vacuum system

F I G. 7
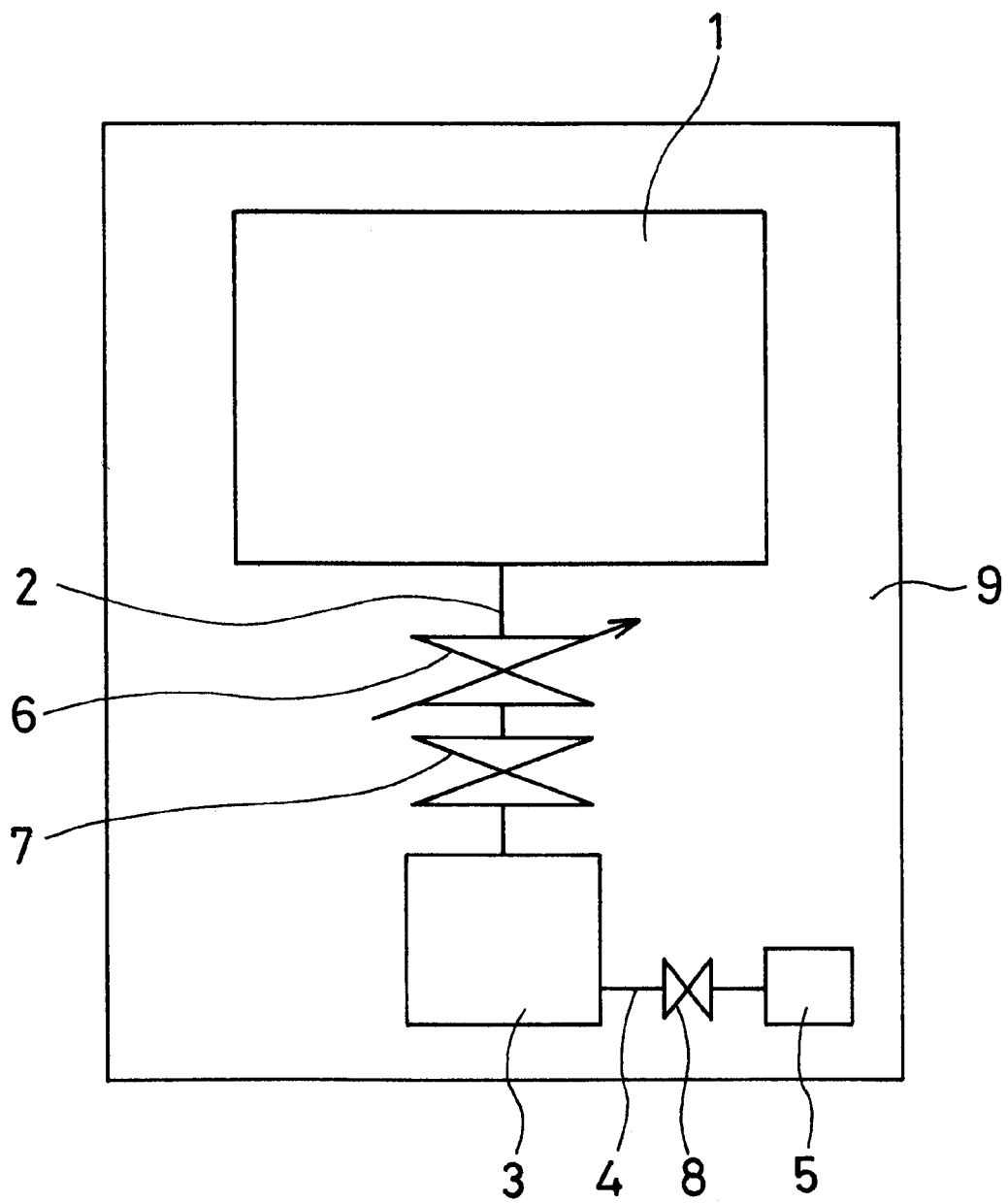

F I G. 1 3
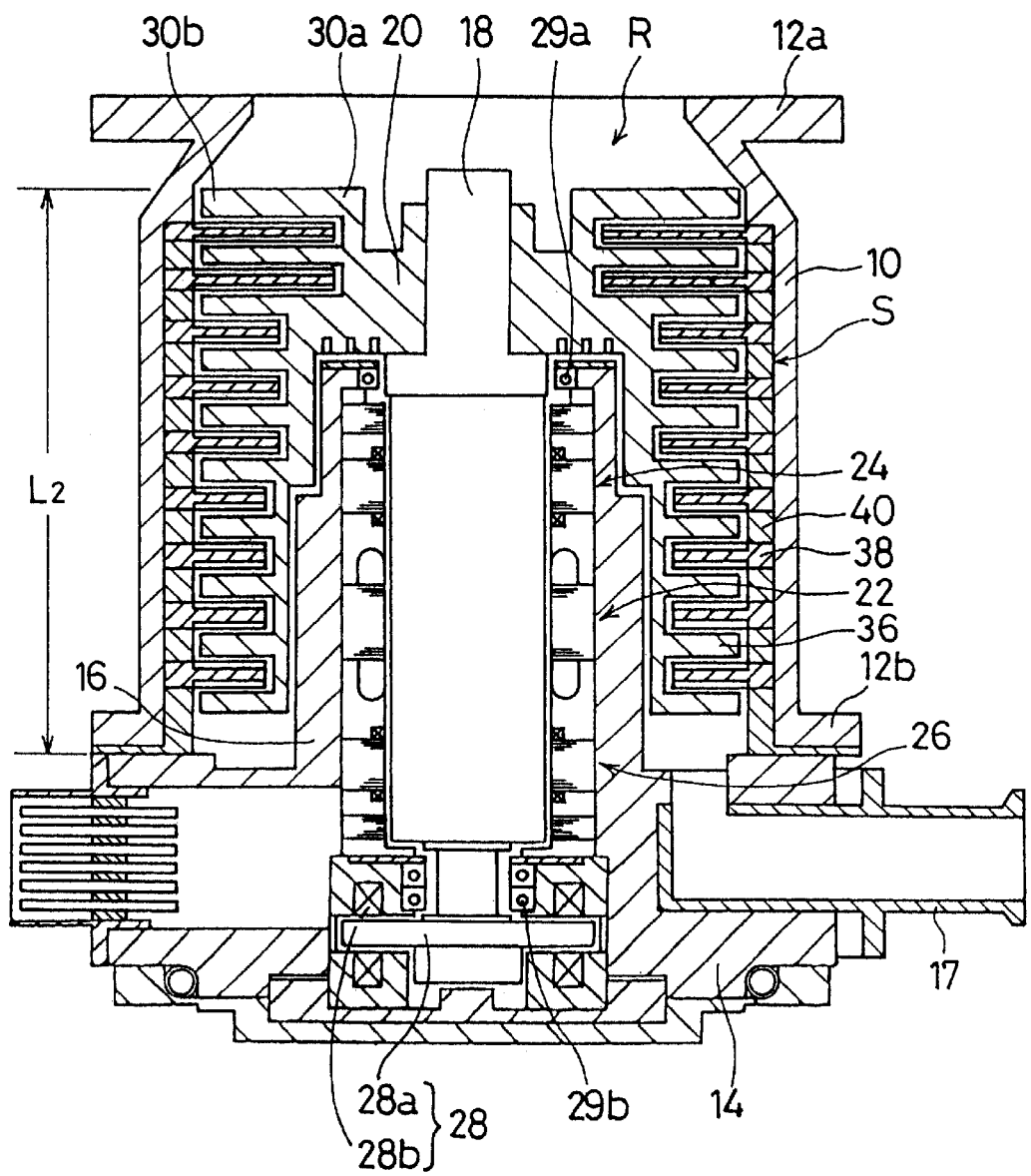

F I G. 1 8
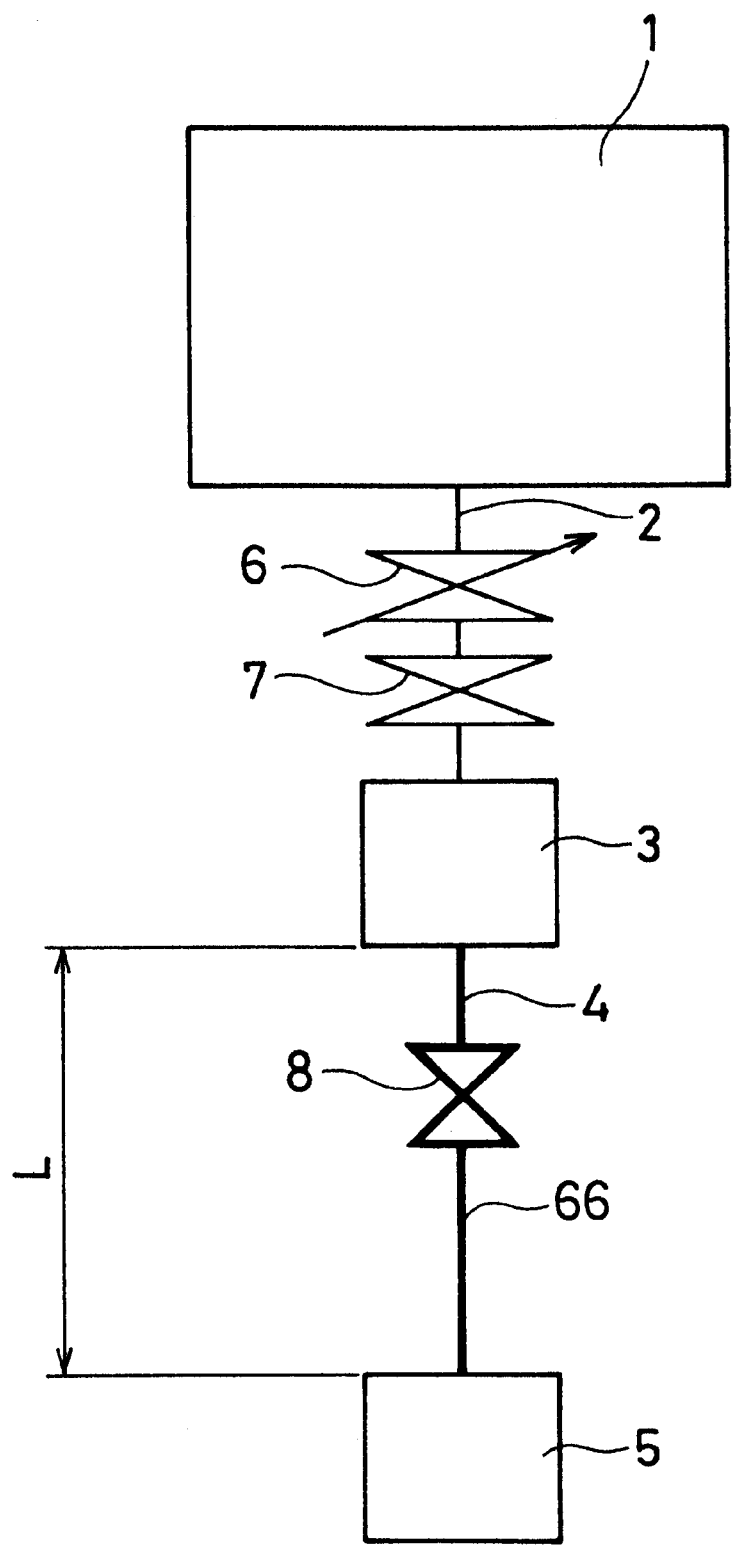

VACUUM EXHAUST SYSTEM

BACKGROUND OF THE INVENTION

1. Field of the Invention:

The present invention relates to a vacuum exhaust system, for example, for use in a semiconductor manufacturing process. More particularly, the invention relates to a vacuum exhaust system capable of exhausting a gas at a relatively large flow rate from a vacuum treatment chamber or the like.

2. Description of the Related Art:

Conventionally, a semiconductor manufacturing apparatus or a liquid crystal manufacturing generally comprises a vacuum chamber for performing etching or CVD processing or the like, and a vacuum pump for evacuating a process gas from the vacuum chamber and reducing the pressure in the vacuum chamber to a desired value. In general as a roots vacuum pump which has an ultimate pressure in a middle vacuum region is used as the vacuum pump. When the higher vacuum level is required, a turbo vacuum pump such as a turbo molecular pump is used as a main pump, and a vacuum pump such as a roots vacuum pump which has an ultimate pressure in a middle vacuum region is used as an auxiliary pump. The auxiliary pump is disposed downstream of the main pump and designed to evacuate the main pump until the back pressure of the main pump becomes a permissible value or lower. The main pump and the auxiliary pump are connected with each other by piping, and a necessary valve device is arranged in the piping. The turbo vacuum pump includes a turbo molecular pump and a molecular drag pump, which have an ultimate pressure in a ultra-high vacuum region and cannot evacuate a gas directly to the atmospheric pressure.

The auxiliary pump is normally disposed near the main pump, but may be installed away from it, or on a different floor. The exhaust speed (L/min) of the auxiliary pump, now generally selected, is such that the ratio of the exhaust speed (L/sec) of the main pump to the exhaust speed (L/min) of the auxiliary pump is about 0.2 to 1.0. The auxiliary pump is relatively large in size and high in cost.

Piping as a connection between the main pump and the auxiliary pump is usually thick piping with an inner diameter of Ø 40 mm or more, if the auxiliary pump is located away from the apparatus unit or on a different floor and the piping is long. Even if the auxiliary pump is located near the apparatus unit and the piping is short, piping with an inner diameter of Ø 25 mm or more is used to connect the main pump and the auxiliary pump.

With such a vacuum exhaust system, the diameter of the piping and the performance of the auxiliary pump (especially, the exhaust speed) are determined by the flow rate of process gas, the length of the piping, and the permissible back pressure of the main pump. Generally, however, the permissible back pressure of the main pump means merely that under the back pressure conditions, a continuous run is possible (rated speed can be maintained without issue of an alarm). If a wide range turbo-molecular pump is assumed as a main pump, for example, it actually occurs that exhaust performance at a low back pressure cannot be maintained before the back pressure reaches the permissible back pressure. A detailed description will be offered later on with reference to FIG. 6.

When a pump is used in the actual semiconductor manufacturing apparatus or liquid crystal manufacturing apparatus, therefore, a sufficient margin for the permissible back pressure of the main pump must be left so that full exhaust performance can be done. Consequently, the diameter of the piping increases.

In an exhaust system using piping having such a large diameter, if the piping is long, the piping itself occupies an expensive space in the clean room, increasing the costs of plant equipment. In the case of conventional large-diameter piping, straight pipes 4a, 4a of a length adapted for on-site conditions and an elbow 4b constituting a bend portion B are prepared and welded beforehand, as shown in FIG. 21B. This requires components such as the elbow 4b, increasing the procurement cost and handling cost. Furthermore, advance inspection of the workshop is necessary, and large expenses have been involved for operations in addition to welding work itself. For large diameter piping, a bending tool such as a bender cannot be used. Even if the tool is usable, the resulting piping poses a problem about strength. The same is true when a flexible tube is used for piping to be assembled at the workshop.

SUMMARY OF THE INVENTION

The present invention has been accomplished to solve the foregoing problems. An object of the invention is to provide a vacuum exhaust system which can realize cost reduction through a saving in entire space, simplification of piping construction work, and so on.

A first aspect of the present invention is a vacuum exhaust system comprising a vacuum chamber, means for introducing a gas into the vacuum chamber, a main pump for exhausting the vacuum chamber and reducing a pressure of the vacuum chamber to a desired pressure, an auxiliary pump disposed downstream from the main pump, and piping for connecting them, wherein an outer diameter of connecting piping as a connection between the main pump and the auxiliary pump is ½ inch (12.7 mm) or less, and a length of the connecting piping and capability of the auxiliary pump are combined so that a back pressure of the main pump becomes 5 Torr or more.

The background for establishment of the concept of this invention will be described. The relationship among the pressure before and after the connecting piping, the diameter of the piping, and the length of the piping is generally expressed by the following equation (1), provided that the connecting piping is a straight pipe.

$$\frac{\pi}{128} \cdot \frac{D^4}{\eta L} \cdot \frac{P_1^2 - P_2^2}{2} = Q \tag{1}$$

where Q: flow rate (Pa·m³/s) of gas introduced into vacuum chamber

D: inner diameter (m) of piping

L: length (m) of piping $P_1$: back pressure (Pa) of main pump $P_2$: pressure (Pa) at inlet of auxiliary pump $P_2=Q/S$ if the exhaust speed of the auxiliary pump is S (m³/s)

η: coefficient of viscosity (Pa·s) of gas introduced into vacuum chamber

Assume that an 8-inch wafer is etched in the vacuum treatment chamber. When an $N_2$ gas is flowed at a maximum flow rate, the main pump back pressure calculated from the equation (1) is as shown in Table 1, provided that the length of the piping is set in consideration of the installation conditions and the conventional inner diameter is 25 mm or 40 mm. In this case, 2.0 Torr or more is sufficient as the permissible back pressure of the main pump.

TABLE 1

| Flow rate sccm | Roughing vacuum pump exhaust speed L/min | Inner diameter of piping mm | Length of piping m | Installation conditions | Back pressure of main pump Torr |
|---|---|---|---|---|---|
| 700 | 3000 | 25 | 2 | Same floor, apparatus near | about 0.8 |
| 700 | 3000 | 25 | 5 | Same floor | about 1.2 |
| 700 | 3000 | 40 | 20 | Upstairs, downstairs | about 0.9 |

Table 2 shows the results of calculation made when the inner diameter of the piping is set at a small value of Ø 10 mm under the same conditions so that on-site piping assembly work can be done. On-site piping assembly refers to a method by which pipes are bent at a site, where the apparatus has been or will be installed, by use of a pipe bending tool such as a bender to complete piping at the site. For example, assume that a vacuum chamber 1, piping 2, and a main pump 3 of a vacuum exhaust system are installed on an upper floor, while an auxiliary pump 5 is installed on a lower floor, as shown in FIG. 20. In this case, a bend portion B is created on the spot by means of a bending tool, such as a bender, to complete piping, as shown in FIG. 21A. Such an operation involving bending on the spot is necessary in most cases even when the components of the system are arranged on the same floor. For on-site piping completion, a flexible tube can be used if the outer diameter of connecting piping is ½ inch (12.7 mm) or less.

TABLE 2

| Flow rate sccm | Roughing vacuum pump exhaust speed L/min | Inner diameter of piping mm | Length of piping m | Installation conditions | Back pressure of main pump Torr |
|---|---|---|---|---|---|
| 700 | 3000 | 10 | 2 | same floor, apparatus near | about 5.0 |
| 700 | 3000 | 10 | 5 | same floor | about 7.0 |
| 700 | 3000 | 10 | 20 | upstairs, downstairs | about 15.0 |

The results of Table 2 show that when the auxiliary pump is installed near the apparatus with the piping length of 2 m therebetween, a main pump having a permissible back pressure of about 5 Torr is necessary to downsize the piping to an inner diameter of Ø 10 mm or less. When the auxiliary pump is installed apart from the apparatus on the same floor, or the apparatus and the auxiliary pump are installed upstairs and downstairs, and the piping length is 5 m and 20 m, respectively, a main pump having a permissible back pressure of about 7 Torr and 15 Torr, respectively, is necessary to downsize the piping to an inner diameter of Ø 10 mm or less.

The present invention is based on the above findings, and comprises a combination of a piping path having a piping diameter made so small as to enable on-site piping assembly, and a vacuum pump which can be run while maintaining a necessary back pressure of the main pump anticipated for the small diameter piping.

A second aspect of the invention is a vacuum exhaust system comprising a vacuum chamber, means for introducing a gas into the vacuum chamber, a main pump for exhausting the vacuum chamber and reducing a pressure of the vacuum chamber to a desired pressure, an auxiliary pump disposed downstream from the main pump, and piping for connecting them, wherein an outer diameter of connecting piping as a connection between the main pump and the auxiliary pump is a value which enables the connecting piping to be assembled by on-site piping bending, and a length of the connecting piping and capability of the auxiliary pump are combined so that a back pressure of the main pump becomes 5 Torr or more.

A third aspect of the invention is a method for constructing a vacuum exhaust system comprising a vacuum chamber, means for introducing a gas into the vacuum chamber, a main pump for exhausting the vacuum chamber and reducing a pressure of the vacuum chamber to a desired pressure, an auxiliary pump disposed downstream from the main pump, and piping for connecting them, wherein connecting piping as a connection between the main pump and the auxiliary pump is assembled by on-site piping bending.

In the vacuum exhaust system or the method for constructing a vacuum exhaust system, the main pump may have a blade exhaust portion composed of moving blades and stationary blades arranged alternately, and at least a part of the blade exhaust portion may be constituted as a diametrical blade exhaust portion having projections and depressions formed in at least one of opposed surfaces of the moving blades and stationary blades.

The use of such a new type of turbo-vacuum pump makes it possible to perform a stable exhaust action even relatively high back pressure conditions. The main pump may be of a wide area type having a thread groove exhaust portion in addition to the blade exhaust portion.

A valve element for covering an inlet openably and closably, and a valve drive mechanism for opening and closing the valve element may be provided integrally with the main pump. With this construction, a single valve device can concurrently function as an opening/closing valve (gate valve) and an opening regulating valve (APC valve). Thus, an exhaust system around the chamber can be constituted compactly.

A heater for raising the temperature of piping may be provided at an arbitrary position of a piping portion which connects the main pump and the auxiliary pump. With the vacuum exhaust system of the invention, the pressure between the main pump and the auxiliary pump is high compared with a conventional vacuum exhaust system. Thus, an exhaust gas tends to build up as a solid product between the main pump and the auxiliary pump. To prevent clogging or the like of the piping, it is effective to raise the piping temperature to the temperature corresponding to the saturation vapor pressure of the exhaust gas or a higher temperature.

Similarly, at least one of a cooling trap and a heating trap for removing the product may be provided between the main pump and the auxiliary pump. By so doing, before the exhaust gas accumulates in the piping as a solid product, the exhaust gas is forcibly cooled to solidification, or is converted into other substance by a thermochemical reaction, whereafter the resulting matter can be removed.

According to the various aspects of the present invention described above, the exhaust system is composed of a combination of a piping path having a piping diameter made so small as to enable on-site assembly of piping, and a vacuum pump which can be run while maintaining a necessary back pressure of the main pump anticipated for the small diameter piping. This construction can decrease the space occupied by the piping itself, and simplify piping assembly work, thereby cutting down on the cost of the vacuum exhaust system as a whole.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a view showing the entire configuration and layout of an embodiment of a vacuum exhaust system of the invention;

FIG. 2 is a sectional view showing an embodiment of a turbo-vacuum pump for use in the vacuum exhaust system of the invention;

FIG. 7 is a view showing another embodiment of the vacuum exhaust system of the invention;

FIG. 13 is a sectional view of a still additional embodiment of the turbo-vacuum pump for use in the vacuum exhaust system of the invention;

FIG. 18 is a view showing still another embodiment of the vacuum exhaust system of the invention;

DETAILED DESCRIPTION OF THE PREFERRED EMBODIMENTS

Figure 3A:
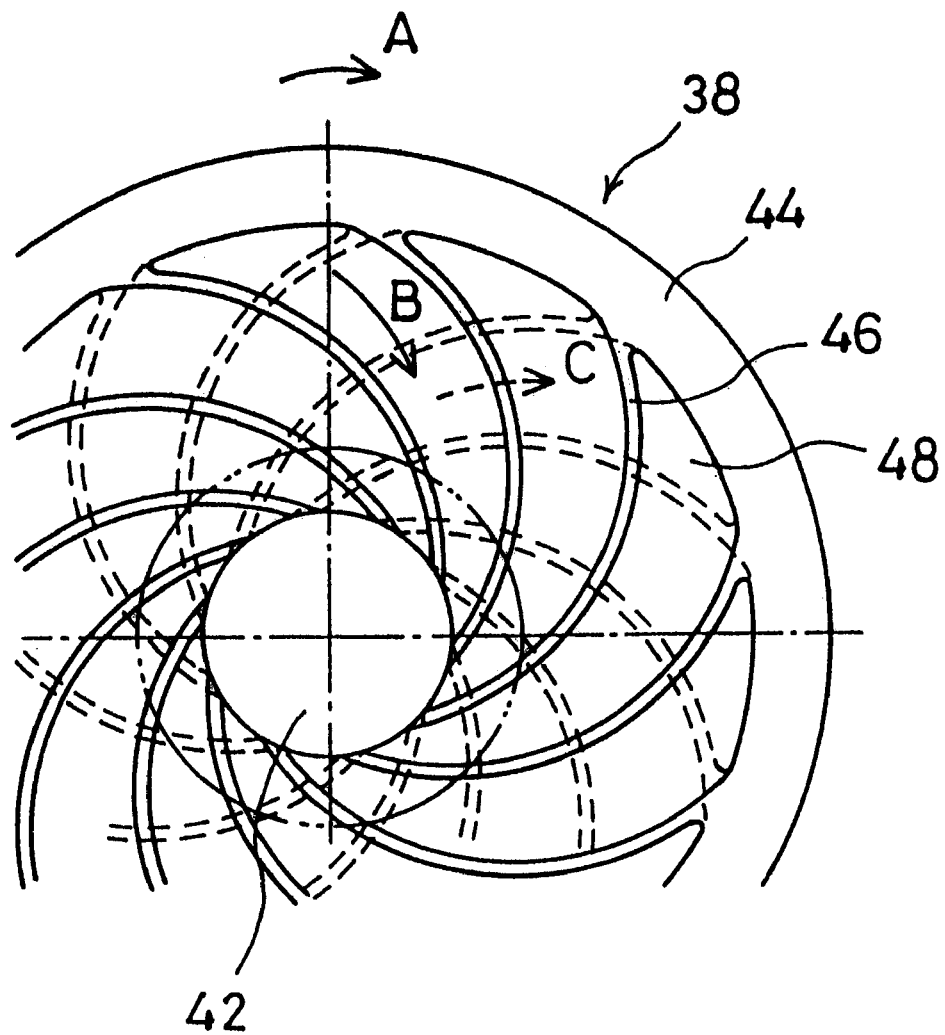
FIG. 3A is a view showing an essential portion of FIG. 2, and 3B is a sectional view of the essential portion.

Embodiments of the present invention will now be described in detail with reference to the accompanying drawings.

FIG. 1 illustrates an embodiment of a vacuum exhaust system according to the invention. This system comprises a vacuum chamber 1 for performing, for example, etching or CVD treatment, a main pump (turbo-vacuum pump) 3 for exhausting a process gas from inside the vacuum chamber 1 via piping 2 and reducing the pressure of the vacuum chamber 1 to a desired pressure, an auxiliary pump 5 disposed downstream from the main pump 3 via connecting piping 4 and adapted to exhaust the main pump 3 until its back pressure becomes a permissible back pressure or lower, and a flow control valve 6 and opening/closing valves 7, 8 disposed in these piping 2 and 4.

The connecting piping 4 as a connection between the main pump 3 and the auxiliary pump 5 has an outer diameter of ½ inch or less, and has a length L of about 2 m. Because of its small outer diameter, this piping 4 accounts for a small space, so that the space inside an expensive clean room can be used effectively. Since the outer diameter of the piping 4 is small, moreover, on-site piping assembly is possible, thus reducing the equipment cost markedly.

The permissible back pressure of the turbo-vacuum pump 3 is at least 5 Torr. This turbo-vacuum pump 3, as shown in FIG. 2, has a rotor (rotating part) R and a stator (fixed part) S housed inside a cylindrical pump casing 10. Between the rotor R and the stator S, an axial blade exhaust portion $L_1$ and a diametrical blade exhaust portion $L_2$ are constituted. At upper and lower ends of the pump casing 10, flanges 12a, 12b are formed. To the upper flange 12a, the piping 2 extending from the vacuum chamber 1 to be exhausted is connected.

The stator S includes a base 14 joined to the lower flange 12b in such a manner as to cover the bottom of the pump casing 10, a fixed tubular portion 16 erected at the center of the base 14, and a fixed-side portion of the axial blade exhaust portion $L_1$ and the diametrical blade exhaust portion $L_2$. An outlet 17 is formed in the base 14. The rotor R includes a main shaft 18 inserted into a fixed tubular portion 16, and a rotating tubular portion 20 attached to the main shaft 18.

A drive motor 22 for rotating the rotor R, and an upper radial bearing 24, a lower radial bearing 26, and an axial bearing 28 for supporting the rotor R in a non-contact manner are provided on an outer surface of the main shaft 18 and an inner surface of the fixed tubular portion 16. The axial bearing 28 has a target disc 28a at the lower end portion of the main shaft 18, and upper and lower electromagnets 28b on the side of the stator S. According to this construction, the rotor R makes high speed rotations while undergoing five-axis active control. Touch-down bearings 29a and 29b are provided at two (upper and lower) sites of the fixed tubular portion 16.

On an upper outer periphery of the rotating tubular portion 20 of the axial blade exhaust portion $L_1$, disc-shaped moving blades 30 are formed integrally. on an inner surface of the pump casing 10, stationary blades 32 are provided in such a manner as to alternate with the moving blades 30. Each of the stationary blades 32 is fixed by having its edge portion pressed from above and below by stationary blade spacers 34. In the moving blades 30, there are radially provided inclined vanes (not shown), each of which extends diametrically between a hub 30a on an inner periphery of the moving blade 30 and a frame 30b on an outer periphery of the moving blade 30. High speed rotations of these vanes exert an axial impact on gas molecules to exhaust the gas.

Figure 3B:
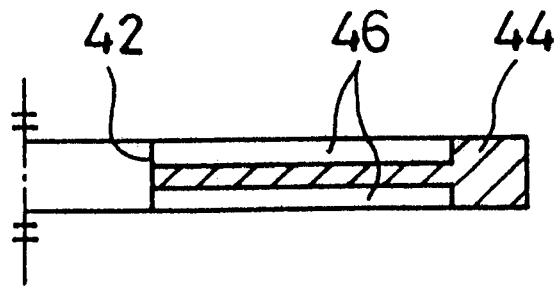

The diametrical blade exhaust portion $L_2$ is provided downstream from, i.e., below the axial blade exhaust portion $L_1$. Nearly similarly to the axial blade exhaust portion $L_1$, disc-shaped moving blades 36 are formed integrally on the outer periphery of the rotating tubular portion 20. On the inner surface of the pump casing 10, stationary blades 38 are provided in such a manner as to alternate with the moving blades 36. Each of the stationary blades 38 is fixed by having its edge portion pressed from above and below by stationary blade spacers 40. Each of the stationary blade 38 is formed in a hollow disc shape. As shown in FIGS. 3A and 3B, on the face side and back side of the stationary blade 38, spiral (volute) ridges 46 are provided from a central hole 42 to a peripheral edge portion 44. Between these ridges 46, grooves 48 are formed. The spiral ridges 46 on the face side, i.e., upper surface, of each stationary blade 38, are formed such that gas molecules flow inward, as indicated by a solid arrow B, in accordance with the rotation of the moving blade 36 indicated by an arrow A in FIG. 3A. The spiral ridges 46 on the back side, i.e., low surface, of each stationary blade 38, on the other hand, are formed such that gas molecules flow outward, as indicated by a dashed arrow C, in accordance with the rotation of the moving blade 36 indicated by the arrow A in FIG. 3A. Such stationary blade 38 is normally formed as a half member. A plurality of the moving blades 36 via the stationary blade spacers 40 such that the stationary blades 38 and the moving blades 36 are alternately arranged, and the resulting assembly is inserted into the casing 10.

According to the foregoing constitution, the turbo-vacuum pump of the present embodiment has a long exhaust path which zigzags downwardly between the stationary blades 38 and the moving blades 36 over an axial short span in the diametrical blade exhaust portion $L_2$. Thus, there is provided a turbo-vacuum pump having high exhaust and compression performance without increasing in its axial length as a whole.

Figure 4:
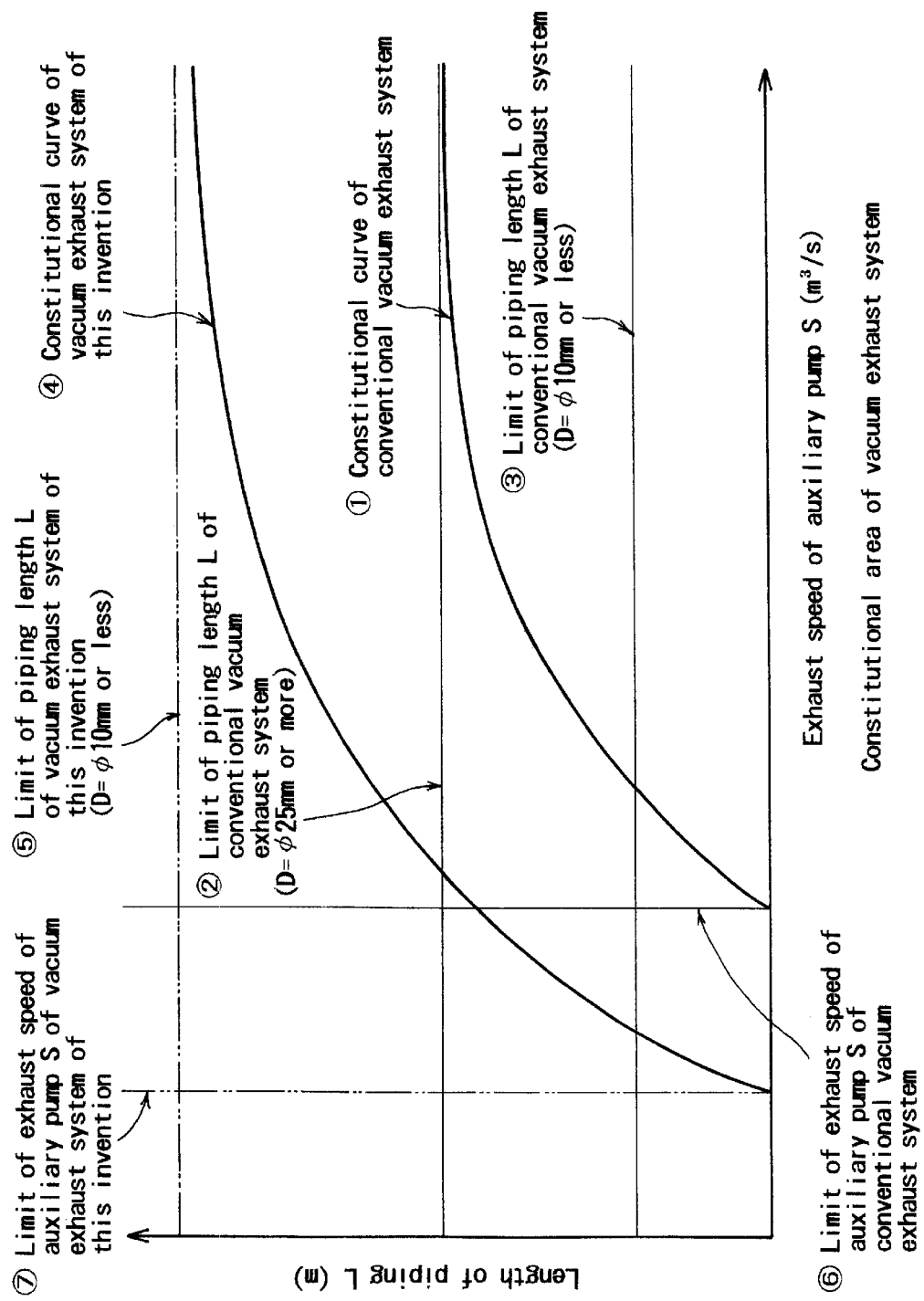
FIG. 4 is a graph showing the performance of the vacuum exhaust system of the invention in comparison with a conventional example.

The performance of a vacuum exhaust system using such a turbo-vacuum pump as the main pump 3 will be described with reference to FIG. 4. An explanation will be offered in comparison with a conventional vacuum exhaust system using a conventional vacuum pump having a permissible back pressure of 3.0 Torr or less. In the drawing, ① is a constitutional curve of a conventional vacuum exhaust system under certain conditions ($P_1$, D, η, Q). The conventional constitutional range is a combination of the parameters in the area on the right of (the area below) the curve. If the inner diameter of piping is reduced from D (Ø25 mm or more) to D' Ø 10 mm or less), ② the limit of the piping length L of the conventional vacuum exhaust system declines to a lower line in the drawing (③ in the drawing). Thus, the constitutional area of the vacuum exhaust system further narrows.

④ is a constitutional curve of the vacuum exhaust system of the invention in which the main pump 3 is a turbo-vacuum pump having a permissible back pressure of $P_1$' (5.0 Torr or more) under the same conditions ($P_1$' (5.0 Torr or more), D' Ø 10 mm or less), η, Q). The constitutional range in this case is the area on the right of (the area below) the curve. The use of this turbo-vacuum pump makes the permissible back pressure of the main pump higher than in the conventional vacuum exhaust system as shown in the drawing. Thus, the piping length L can be increased, and the exhaust speed S of the auxiliary pump 5 can be decreased (⑥→⑦ in the drawing).

Figure 5:
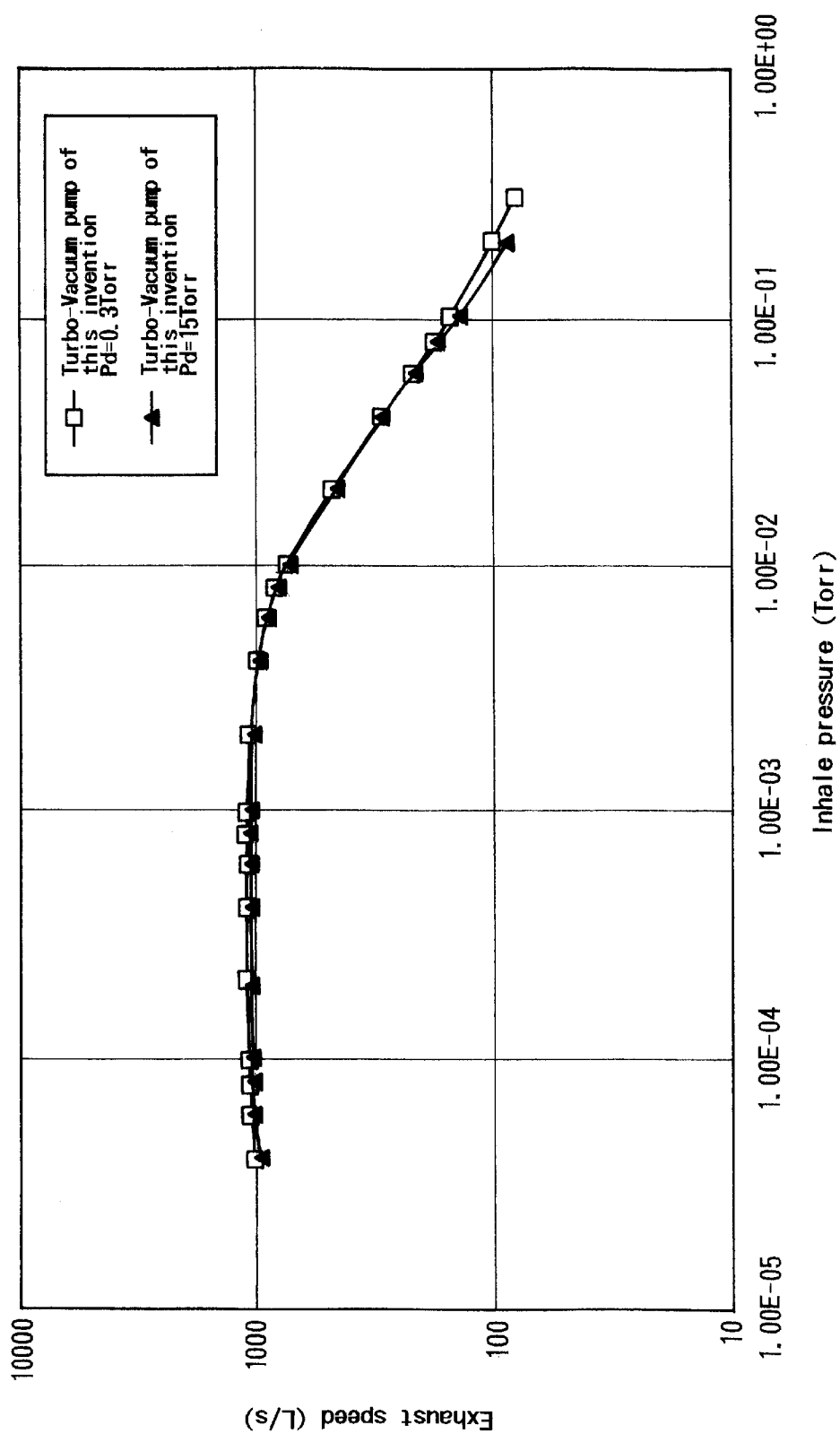
FIG. 5 is a chart showing exhaust speed curves of the vacuum exhaust system of the invention.
Figure 6:
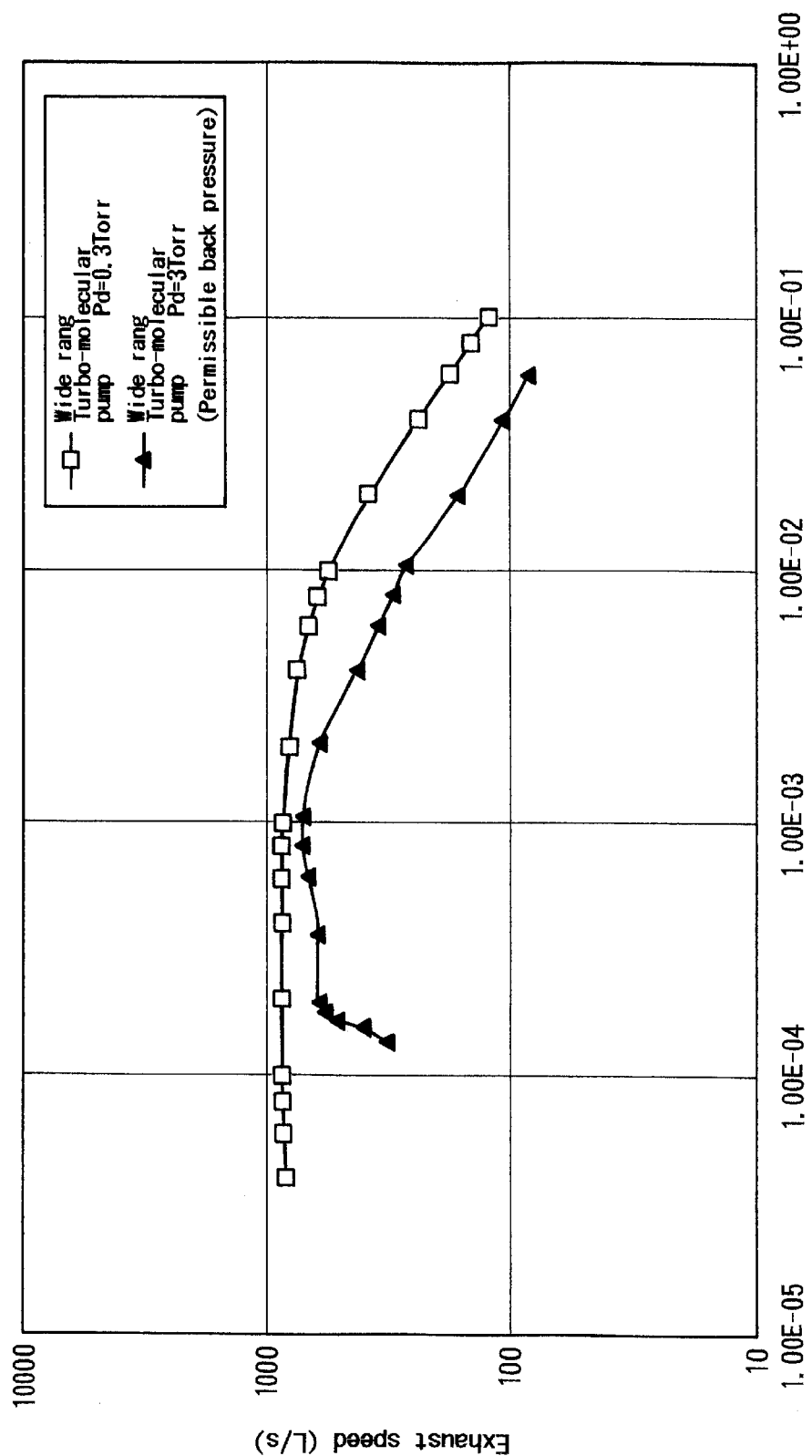
FIG. 6 is a chart showing exhaust speed curves of a conventional vacuum exhaust system.

As shown in FIG. 5, moreover, the above turbo-vacuum pump can be operated, with performance such as exhaust speed and achievable degree of vacuum being maintained, even when the back pressure is 15 Torr. With a conventional turbo-molecular pump having a permissible back pressure of 3.0 Torr, on the other hand, the exhaust speed at a back pressure of 3.0 Torr is much lower than that at a back pressure of 0.3 Torr, as shown in FIG. 6. This is not feasible.

According to the vacuum exhaust system constitution with a small region of auxiliary pump exhaust speed S, in particularly, cost reduction and space saving of the vacuum exhaust system can be achieved in addition to the decrease in the piping diameter. Other advantages are that since the auxiliary pump 5 is downsized, the auxiliary pump 5 need not be installed in a remote utility space such as downstairs, but can be installed near the apparatus unit or near the main pump 3 (within the apparatus unit). Therefore, as shown in FIG. 7, the auxiliary pump 5 can be installed on a relatively narrow installation floor. Thus, a marked saving in space, or unitization, of the exhaust system can be realized.

Figure 8A:
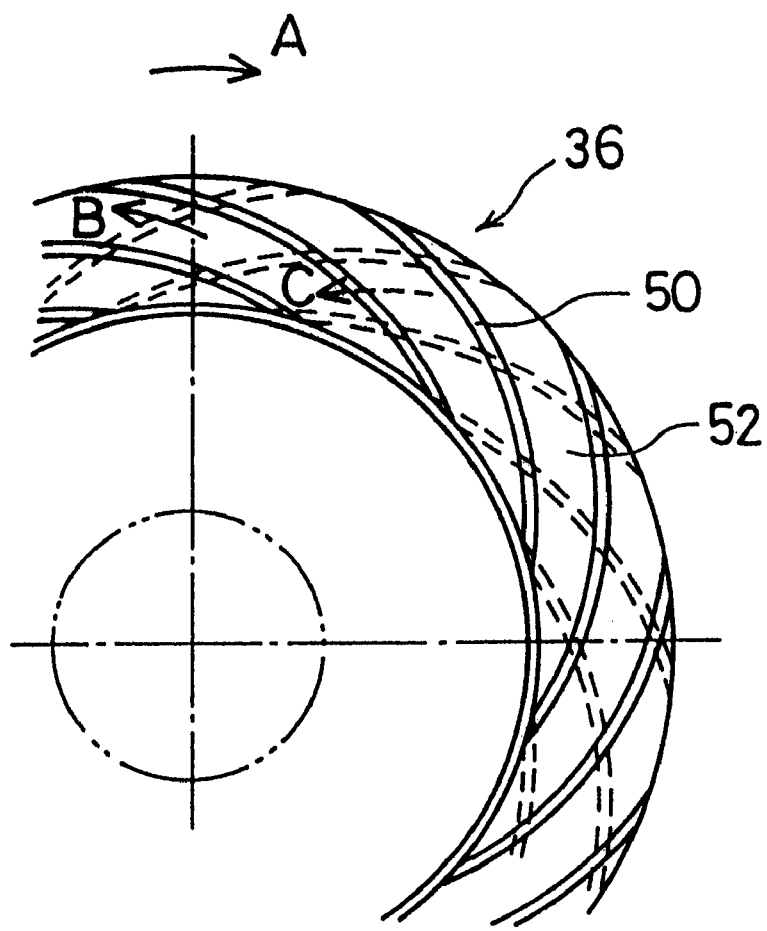
FIGS. 8A and 8B are views showing another embodiment of the turbo-vacuum pump for use in the vacuum exhaust system of the invention, FIG. 8A being a view showing an essential portion of this embodiment, and FIG. 8B being a sectional view of the essential portion.
Figure 8B:
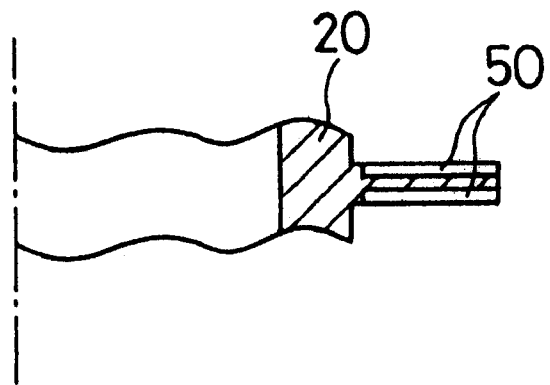

FIGS. 8A and 8B show another embodiment of the turbo-vacuum pump usable as the main pump 3 of the vacuum exhaust system of the invention. In this pump, spiral ridges 50 are formed on the rotor side. That is, the spiral ridges 50 are formed in outer edge portions of the face side and back side of a moving blade 36. Between these spiral ridges 50, spiral grooves 52 are formed. The surface of a stationaryblade 38 is formed to be flat. The spiral ridges 50 on the face side, i.e., upper surface, of each moving blade 36, are formed such that gas molecules flow outward, as indicated by a solid arrow B, in accordance with the rotation of the moving blade 36 indicated by an arrow A in FIG. 8A. The spiral ridges 50 on the back side, i.e., lower surface, of each moving blade 36, on the other hand, are formed such that gas molecules flow inward, as indicated by a dashed arrow C, in accordance with the rotation of the moving blade 36 indicated by the arrow A in FIG. 8A.

According to this embodiment as well, a long exhaust path, which zigzags downwardly between the stationary blades 38 and the moving blades 36, is formed in the cross section including the axis of FIG. 2 in the diametrical blade exhaust portion $L_2$, as in the preceding embodiment. Thus, there is provided a turbo-vacuum pump having high exhaust and compression performance without increasing in its axial length as a whole.

Compared with a wide area turbo-molecular pump having a conventional thread groove exhaust portion, this turbo-vacuum pump has the following advantages. That is, in the conventional thread groove exhaust portion, clearance is formed in the radial direction between the rotor and the stator. The clearance is liable to change in accordance with elastic deformation during rotor rotation, thennal deformation during an increase in rotor temperature, and creep deformation associated with continuous operation of the rotor at a high temperature. Thus, stable performance is difficult to obtain. In the diametrical blade exhaust portion $L_2$ in the turbo-vacuum pump of the present embodiment, on the other hand, each clearance is formed in the axial direction between two adjacent discs, so that the shaft and the casing are minimally susceptible to elastic load and temperature change. Therefore, in the presence of elastic deformation, thermal deformation, or creep deformation, there is little change in clearance. Hence, stable performance can be maintained, and durability and resistance to overload operation is excellent.

Figure 9:
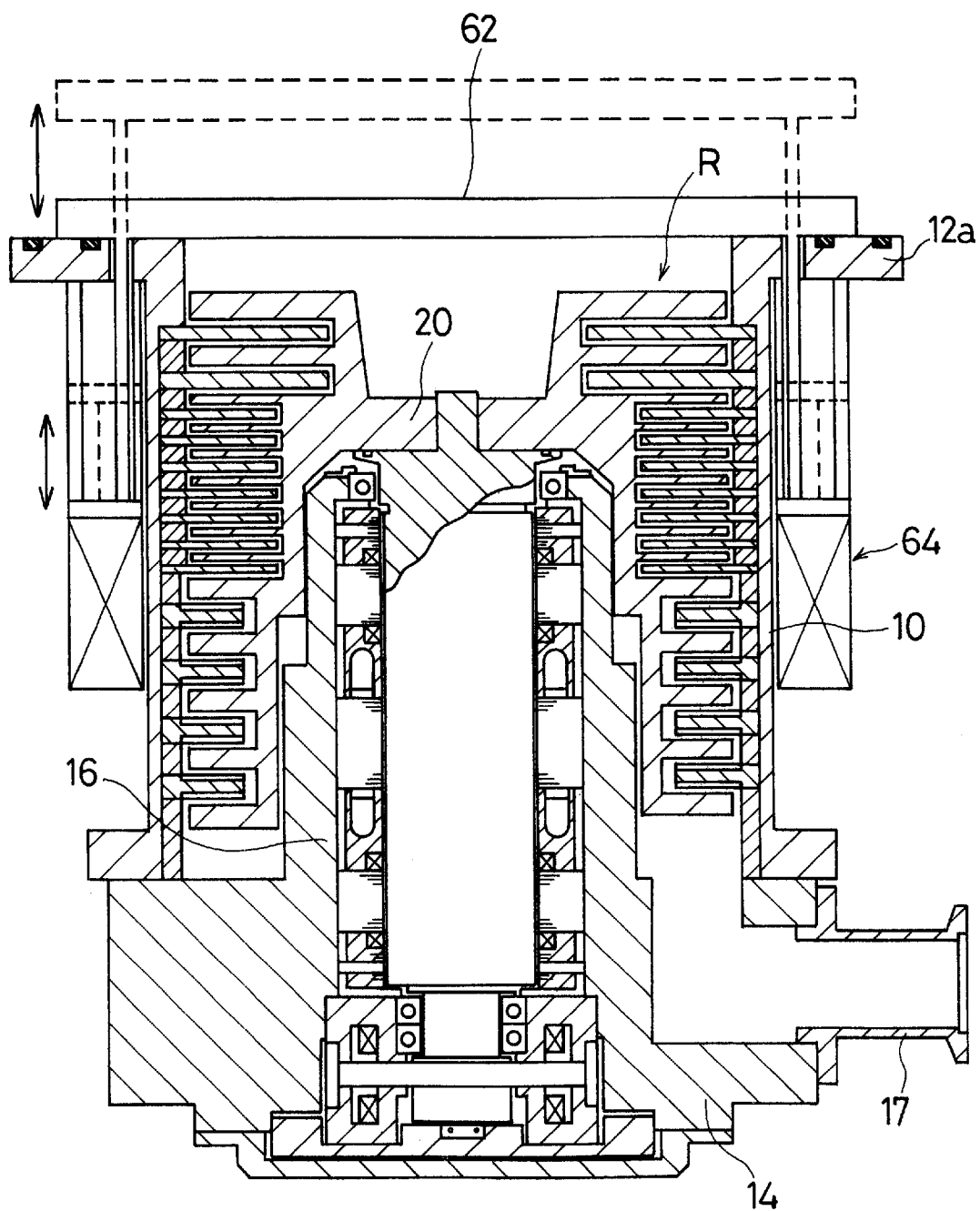
FIG. 9 is a sectional view of still another embodiment of the turbo-vacuum pump for use in the vacuum exhaust system of the invention.

FIG. 9 shows a modified example of the turbo-vacuum pump shown in FIG. 2. This turbo-vacuum pump has a valve element 62 for covering an inlet openably and closably, and a valve drive mechanism 64 for opening and closing the valve element 62. The valve drive mechanism 64 is provided integrally with the pump body. This valve device is capable of opening regulation, and this single valve device can concurrently function as an opening/closing valve (gate valve) and an opening regulating valve (APC valve). Because of having the integral valve device concurrently serving as an opening/closing valve and an opening regulating valve, an exhaust system around the chamber can be constituted compactly.

Figure 10:
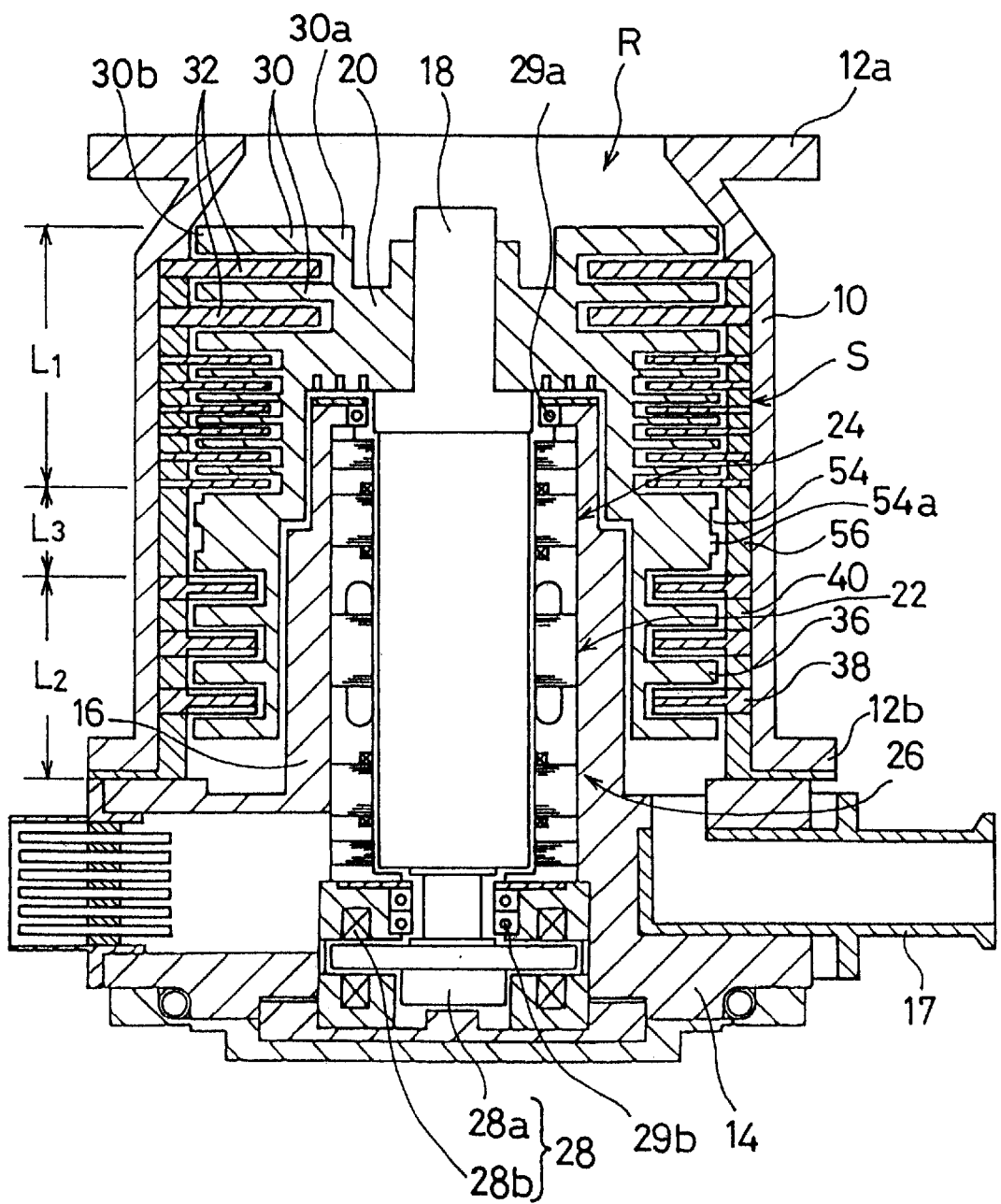
FIG. 10 is a sectional view of a further embodiment of the turbo-vacuum pump for use in the vacuum exhaust system of the invention.
Figure 11:
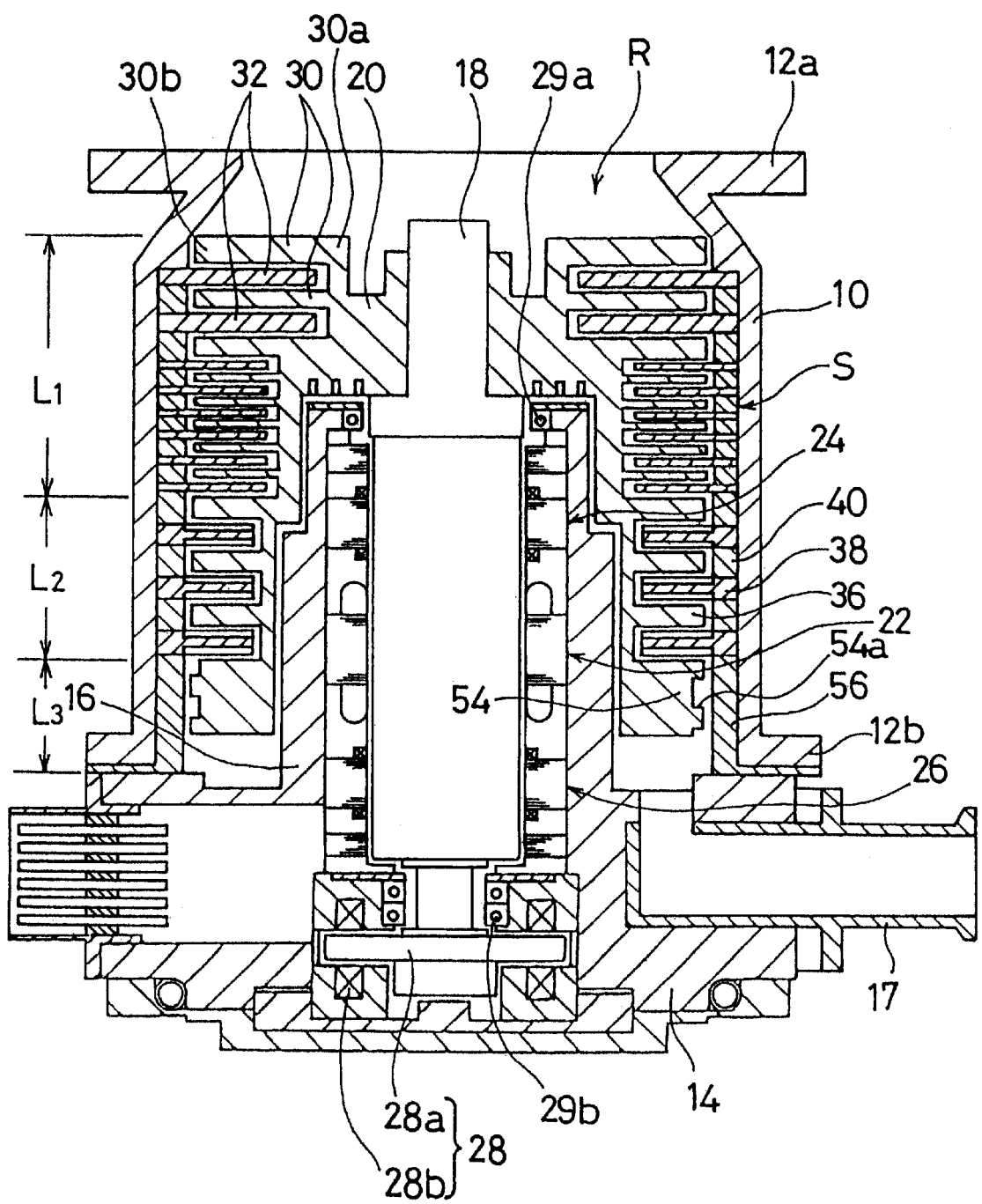
FIG. 11 is a sectional view of a still further embodiment of the turbo-vacuum pump for use in the vacuum exhaust system of the invention.

FIGS. 10 and 11 show other embodiments of the turbo-vacuum pump. FIG. 10 indicates a three-stage exhaust structure having a thread groove exhaust portion $L_3$ provided between an axial blade exhaust portion $L_1$ and a diametrical blade exhaust portion $L_2$. That is, a rotating tubular portion 20 has a thread groove portion 54 having a thread groove 54a formed in an outer surface of a middle-stage portion of the rotating tubular portion 20. At a site on the stator side opposed to the thread groove portion 54, a thread groove exhaust portion spacer 56 is provided. According to this construction, gas molecules are dragged for evacuation as a result of high speed rotations of the rotor. In FIG. 11, a thread groove exhaust portion $L_3$ is provided downstream from a diametrical blade exhaust portion $L_2$.

Figure 12:
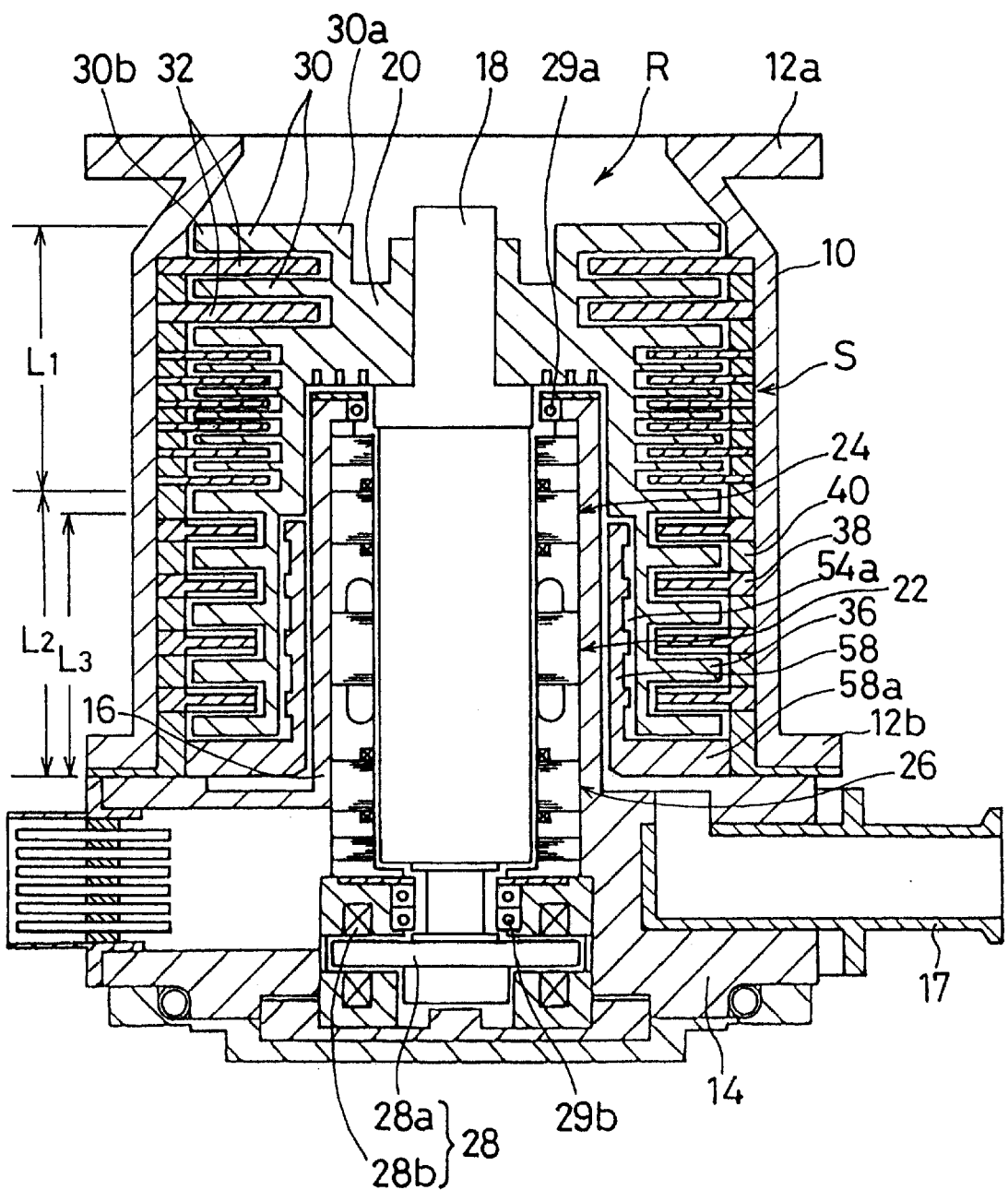
FIG. 12 is a sectional view of an additional embodiment of the turbo-vacuum pump for use in the vacuum exhaust system of the invention.

FIG. 12 also shows an embodiment in which a thread groove exhaust portion $L_3$ is provided downstream from a diametrical blade exhaust portion $L_2$. The thread groove exhaust portion $L_3$ is provided on the back side of a rotating tubular portion 20 constituting a diametrical blade exhaust portion $L_2$. That is, inwardly of a site corresponding to the diametrical blade exhaust portion $L_2$ in the rotating tubular portion 20, a gap is formed between the rotating tubular portion 20 and the outer surface of a fixed tubular portion 16 of a stator S. In this gap, a thread groove exhaust portion sleeve 58 having a thread groove 54a formed on an outer surface thereof is inserted. The thread groove exhaust portion sleeve 58 is fixed onto a base 14 via a lower flange portion 58a.

The thread groove 54a is formed so as to exhaust gas molecules upwards by a drag action due to rotations of the rotor R. As a result, there is formed a channel starting at the lowermost stage of the diametrical blade exhaust portion $L_2$, ascending between the rotating tubular portion 20 and the thread groove exhaust portion sleeve 58, further descending through the gap between the thread groove exhaust portion sleeve 58 and the fixed tubular portion 16, and leading to the outlet 17. According to this embodiment, the diametrical blade exhaust portion $L_2$ and the thread groove exhaust portion $L_3$ are provided as overlapping in the axial direction. Thus, there is provided a turbo-vacuum pump having high exhaust and compression performance without increasing in its axial length as a whole.

FIG. 13 shows another embodiment of the invention as a multi-stage turbo-vacuum pump in which no axial blade exhaust portion is provided, but all the stages are composed of a diametrical blade exhaust portion $L_2$. Compared with the above-mentioned type combined with the axial blade exhaust portion, this embodiment produces the effect that a high flow rate can be fed in a higher pressure region than in a molecular flow region in which an ordinary turbo-molecular pump is used.

Figure 14:
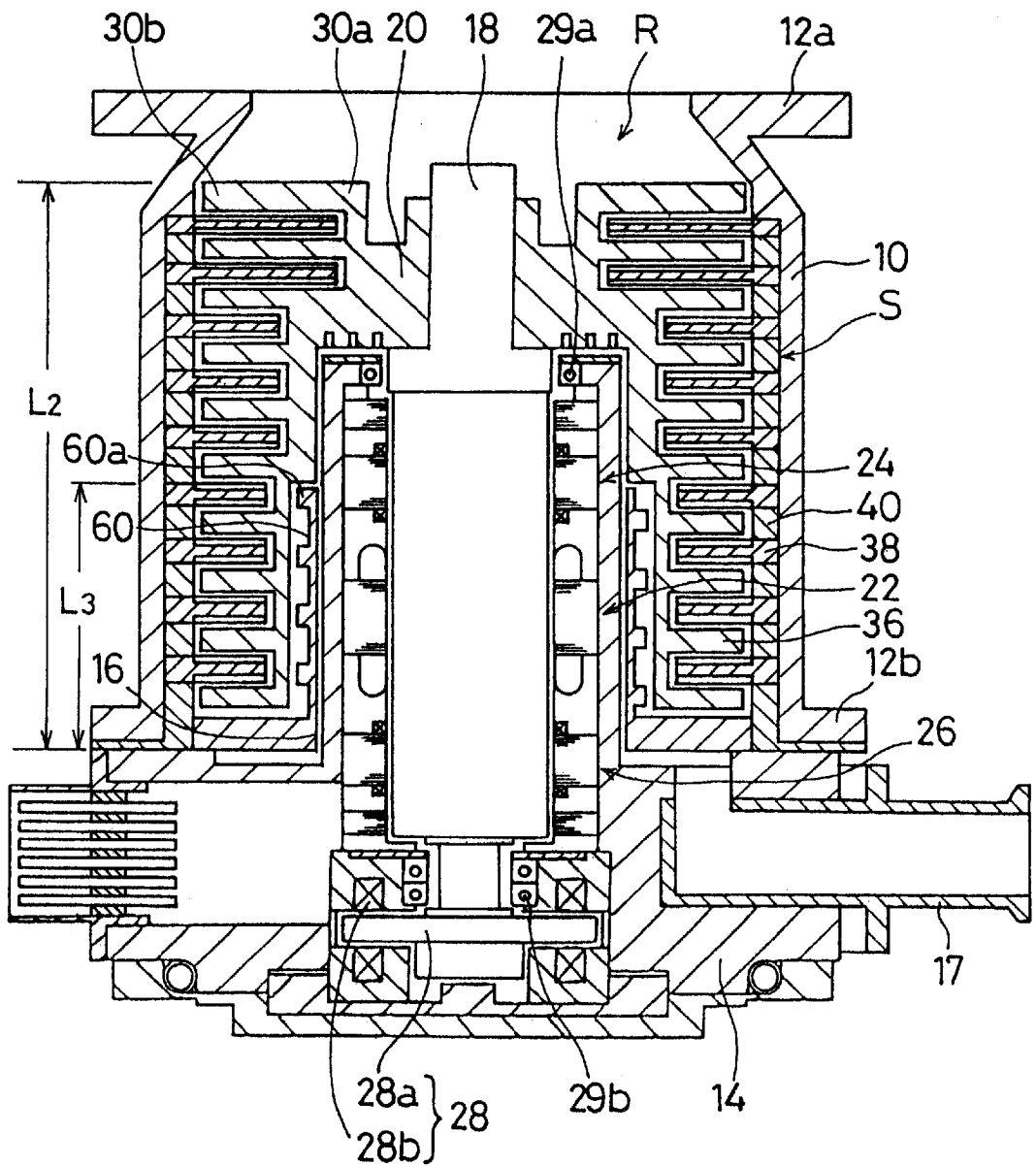
FIG. 14 is a sectional view of a further additional embodiment of the turbo-vacuum pump for use in the vacuum exhaust system of the invention.

FIG. 14 shows a thread groove exhaust portion $L_3$ added as a subsequent stage to the embodiment of FIG. 13. In the present embodiment, a groove exhaust portion sleeve (a second fixed tubular portion) 60 is provided between a rotating tubular portion 20 and a fixed tubular portion 16. A thread groove 60a is formed on an outer surface of the groove exhaust portion sleeve 60, and the thread groove exhaust portion $L_3$ is formed between the rotating tubular portion 20 and the groove exhaust portion sleeve 60. Thus, an exhaust channel reciprocating in the axial direction is formed, whereby a compact pump affording a high exhaust amount can be constituted.

Figure 15:
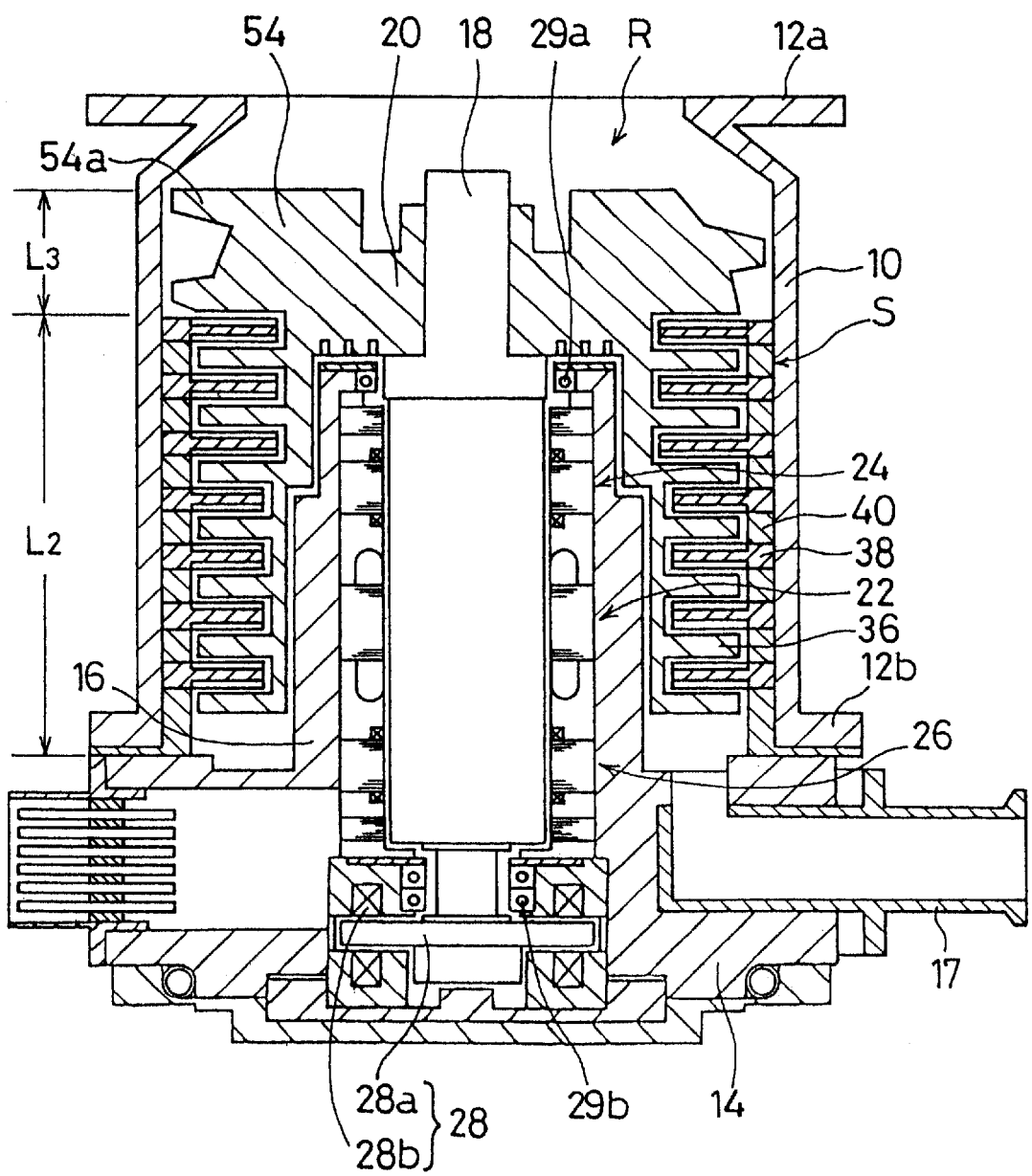
FIG. 15 is a sectional view of a still further additional embodiment of the turbo-vacuum pump for use in the vacuum exhaust system of the invention.

FIG. 15 shows a turbo-vacuum pump as a further embodiment of the invention, in which a groove exhaust portion $L_3$ having a tubular thread groove portion 54 formed a thread groove 54a of its outer surface is provided as a preceding stage, and a diametrical blade exhaust portion $L_2$ is provided as a succeeding stage. In comparison with the combination of the axial blade exhaust portion $L_1$ and the diametrical blade exhaust portion $L_1$ shown in FIG. 2, the present embodiment obtains the following effects. That is, the axial exhaust portion delivers its performance more effectively in a molecular flow region. Where as the axial thread groove exhaust portion acts effectively in a pressure region of about 1 to 1,000 Pa, thus permitting an operation in a viscous flow region more similar to the atmosphere.

Figure 16A:
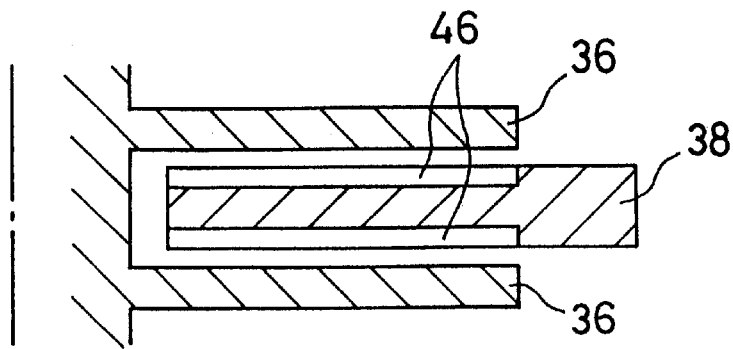
FIGS. 16A to 16D are sectional views showing modified examples of the manner of providing. projecting and depressing in a turbo-moleular pump according to the invention.
Figure 16B:
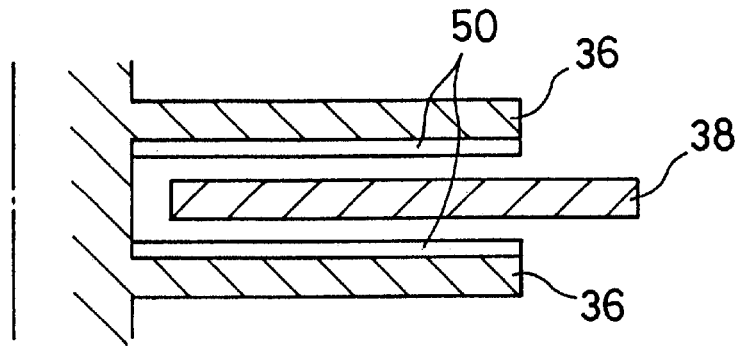
Figure 16C:
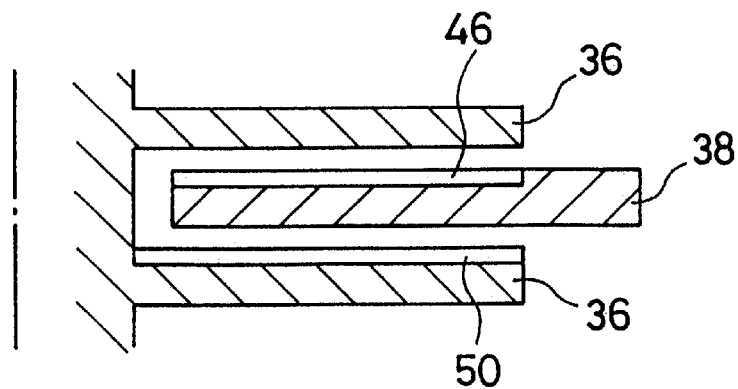
Figure 16D:
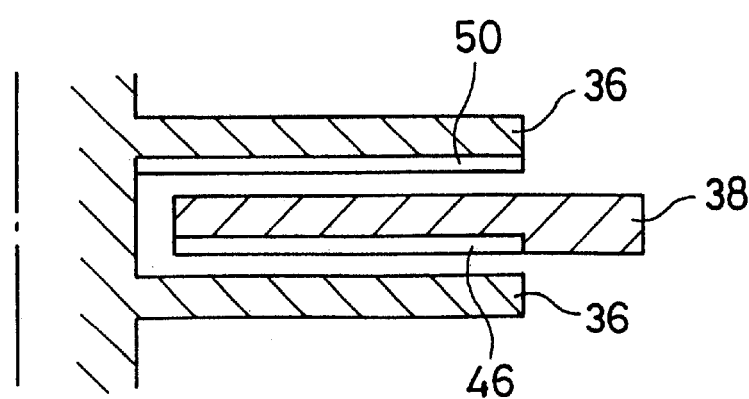
Figure 17A:
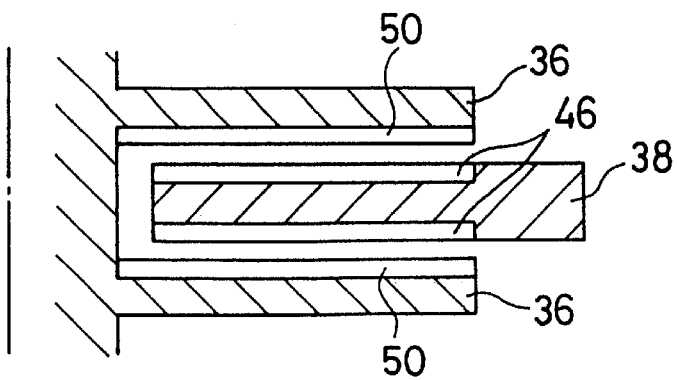
FIGS. 17A to 17E are sectional views showing other modified examples of the manner of providing projections and depressions in the turbo-molecular pump of the invention.
Figure 17B:
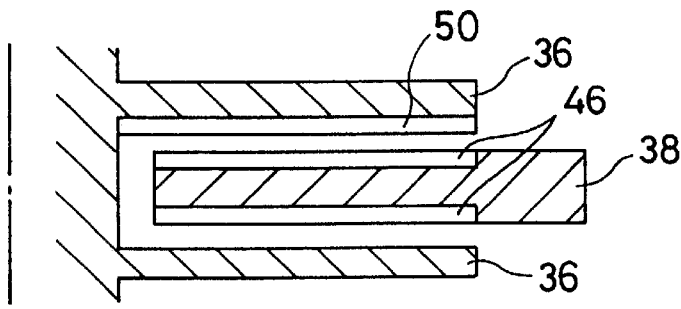
Figure 17C:
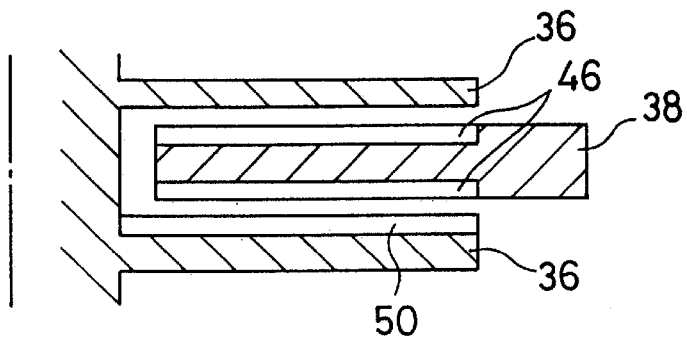
Figure 17D:
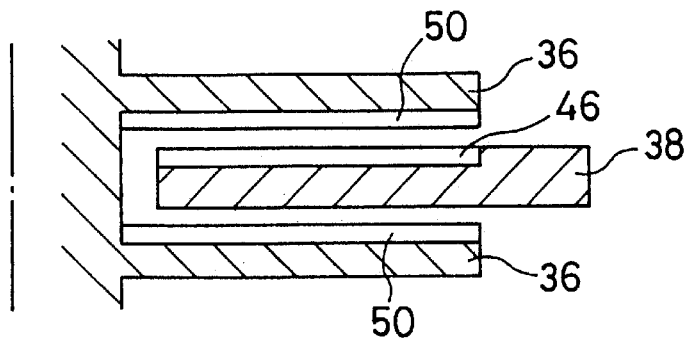
Figure 17E:
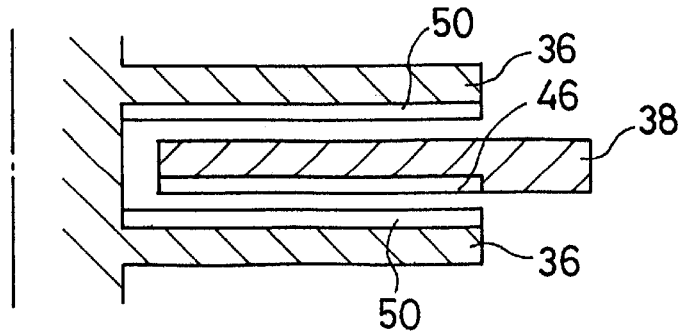

In the above embodiment, the diametrical blade exhaust portion $L_2$ has projections and depressions 46, 50 of predetermined shapes formed in one of the stationary blade 38 and the moving blade 36, as shown in FIGS. 16A and 16B. However, as shown in FIGS. 16C to 16D and FIGS. 17A to 17E, projections and depressions 46, 50 may be arranged, as necessary, on at least one of the opposed surfaces of the stationary blade 38 and the moving blade 36. Such an arrangement may be modified and applied in each stage of the diametrical blade exhaust portion $L_2$.

FIG. 18 shows still another embodiment of the invention, in which a heater 66 for raising the temperature of piping is provided at an arbitrary position, including an opening/closing valve 8, of a piping 4 which connects a main pump 3 and an auxiliary pump 5. With the vacuum exhaust system of the invention, the pressure between the main pump 3 and the auxiliary pump 5 is high compared with a conventional vacuum exhaust system. Thus, an exhaust gas tends to build up as a solid product inner surface of the piping 4, and may thereby cause clogging of the piping 4. To prevent this, the heater 66 is provided to raise the temperature of the piping 4 to the temperature corresponding to the saturation vapor pressure of the exhaust gas or a higher temperature.

Figure 19:
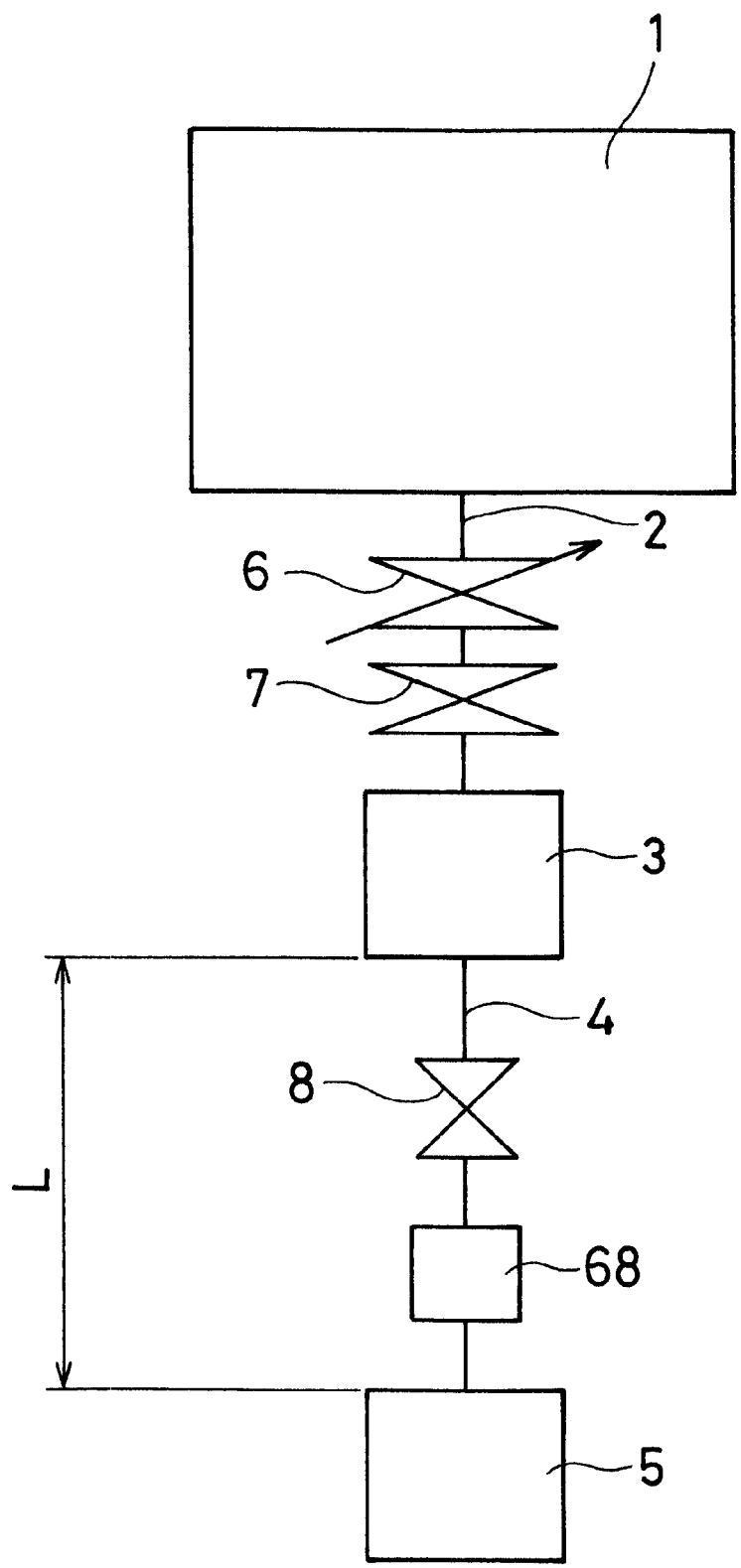
FIG. 19 is a view showing a further embodiment of the vacuum exhaust system of the invention.

FIG. 19 shows a further embodiment of the invention, in which a trap 68 for removing a reaction product is provided in piping 4 between a main pump 3 and an auxiliary pump 5. The trap 68 may be at least one of a cooling trap and a heating trap. By providing such a trap 68, before an easily solidifiable constituent of the exhaust gas accumulates in the piping 4 as a solid product, this constituent is forcibly cooled, or is converted into other substance by a thermochemical reaction, whereafter the resulting matter can be removed.

In the above embodiments, the outer diameter of the piping 4 between the main pump 3 and the auxiliary pump 5 has been set at ½ inch or less. However, a piping portion thicker than the outer diameter of ½ inch may be present, depending on the outlet diameter of the main pump 3, the inlet diameter of the auxiliary pump 5, or the size of a vacuum component mounted between the main pump 3 and the auxiliary pump 5. It suffices for the main piping diameter to be ½ inch or less.

Figure 20:
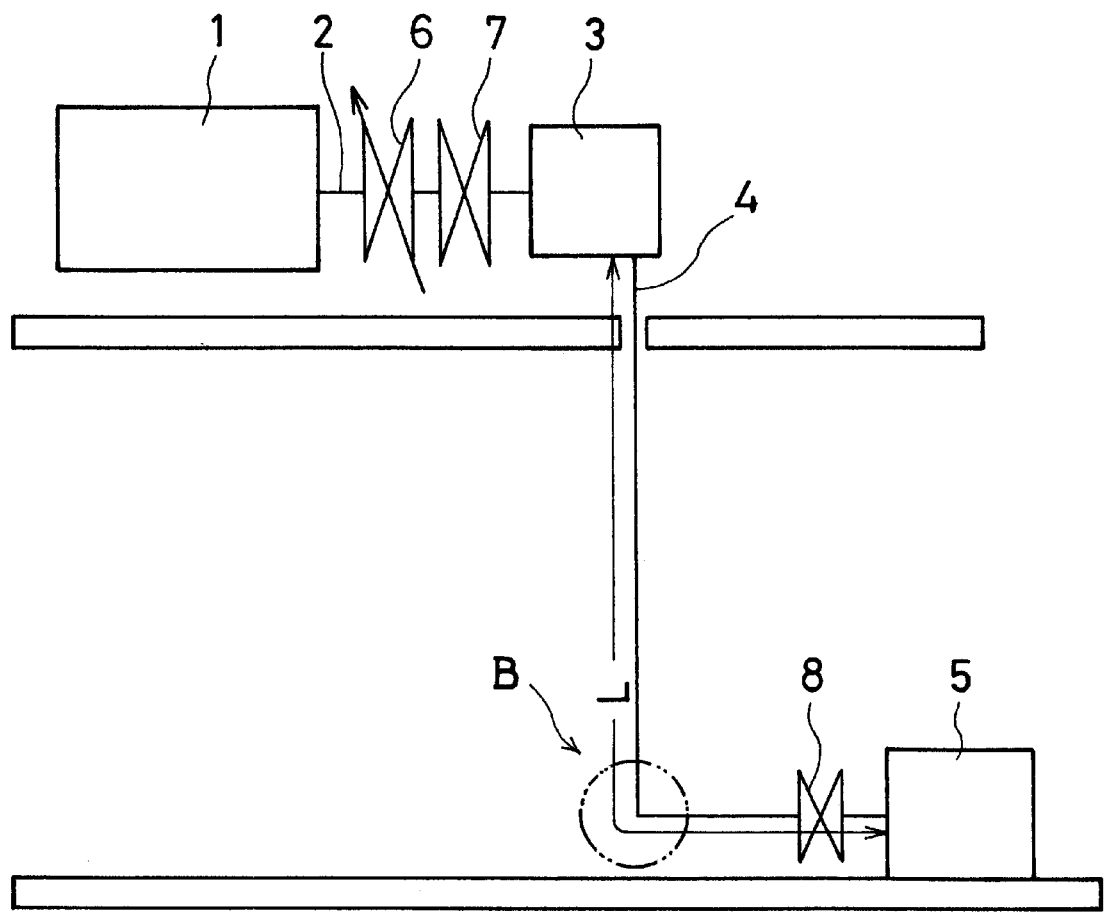
FIG. 20 is a view showing a still further embodiment of the vacuum exhaust system of the invention.
Figure 21A:
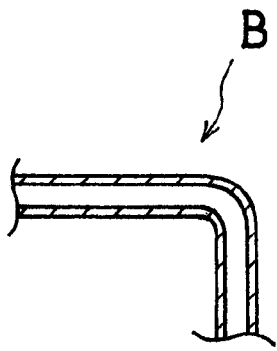
FIGS. 21A and 21B are views showing a bend of the piping, FIG. 21A showing that in the invention, and FIG. 21B showing that in a conventional system.
Figure 21B:
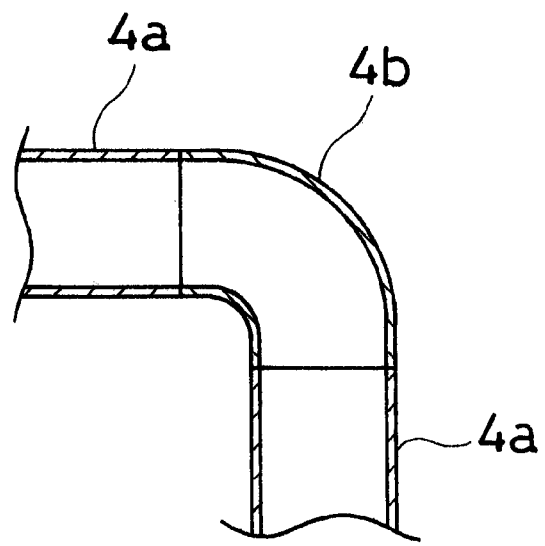

FIG. 20 shows a still further embodiment of the vacuum exhaust system of the invention, in which a vacuum chamber 1, piping 2, and a main pump 3 are installed on an upper floor, while an auxiliary pump 5 is installed on a lower floor. Connecting piping 4 as a connection between the main pump 3 and the auxiliary pump 5 has an outer diameter of ½ inch or less, and has a length L of about 20 m. The connecting piping 4 has a bend portion B, which is created by means of a bending tool such as a bender. In this case, the permissible back pressure of the main pump 3 is about 15.0 Torr.

As the auxiliary pump 5, an oil-sealed rotary vacuum pump, or a dry-sealed vacuum pump is generally used. Examples of the dry-sealed vacuum pump are a roots vacuum pump, a screw vacuum pump, a claw vacuum pump, a scroll vacuum pump, a thread groove vacuum pump, a piston vacuum pump, and a diaphragm vacuum pump. As measures for promoting the downsizing of the auxiliary pump 5, the piston vacuum pump and diaphragm vacuum pump, in particular, are simple in structure, and can be made very small in size.

In each of the drawings, one main pump and one auxiliary pump are combined. However, a plurality of main pumps may be combined with one auxiliary pump.

While the present invention has been described in the foregoing fashion, it is to be understood that the invention is not limited thereby, but may be varied in many other ways. Such variations are not to be regarded as a departure from the spirit and scope of the invention, and all such modifications as would be obvious to one skilled in the art are intended to be included within the scope of the appended claims.

What is claimed is:

1. A vacuum exhaust system comprising:

a vacuum chamber;

means for introducing a gas into said vacuum chamber;

a main pump for exhausting said vacuum chamber and reducing a pressure of said vacuum chamber to a desired pressure;

an auxiliary pump disposed downstream from said main pump; and piping for connecting said main pump and said auxiliary pump, wherein an outer diameter of connecting piping used as a connection between said main pump and said auxiliary pump is ½ inch (12.7 mm) or less, and wherein a length of said connecting piping and capability of said auxiliary pump are combined so that a back pressure of said main pump becomes 5 Torr or more.

2. The vacuum exhaust system of claim 1, wherein said main pump has a blade exhaust portion composed of moving blades and stationary blades arranged alternately; and at least a part of blade exhaust portion is constructed as a diametrical blade exhaust portion having projections and depressions formed in at least one of opposed surfaces of said moving blades and stationary blades.

3. A vacuum exhaust system comprising:

a vacuum chamber;

means for introducing a gas into said vacuum chamber;

a main pump for exhausting said vacuum chamber and reducing a pressure of said vacuum chamber to a desired pressure;

an auxiliary pump disposed downstream from said main pump; and piping for connecting said main pump and said auxiliary pump, wherein an outer diameter of connecting piping used as a connection between said main pump and said auxiliary pump is a value which enables said connecting piping to be assembled by on-site piping bending; and a length of said connecting piping and capability of said auxiliary pump are combined so that a back pressure of said main pump becomes 5 Torr or more.

4. The vacuum exhaust system of claim 3, wherein said main pump has a blade exhaust portion composed of moving blades and stationary blades arranged alternately; and at least a part of said blade exhaust portion is constructed as a diametrical blade exhaust portion having projections and depressions formed in at least one of opposed surfaces of said moving blades and stationary blades.

* * * * *